(12) United States Patent
Regev et al.

(10) Patent No.: US 12,166,513 B1
(45) Date of Patent: Dec. 10, 2024

(54) ADAPTIVE DIGITAL POST-DISTORTION AND MODULATION AND CODING SCHEME INDEX REPORTING

(71) Applicant: QUALCOMM Incorporated, San Diego, CA (US)

(72) Inventors: Aviv Regev, Tel Aviv (IL); Amit Moses, Tel Aviv (IL); Ronen Shaked, Kfar Saba (IL)

(73) Assignee: QUALCOMM Incorporated, San Diego, CA (US)

( * ) Notice: Subject to any disclaimer, the term of this patent is extended or adjusted under 35 U.S.C. 154(b) by 56 days.

(21) Appl. No.: 18/317,667

(22) Filed: May 15, 2023

(51) Int. Cl.
| | |
|---|---|
| *H04B 1/04* | (2006.01) |
| *H03F 1/32* | (2006.01) |
| *H04L 1/00* | (2006.01) |
| *H04L 27/01* | (2006.01) |
| *H04L 27/00* | (2006.01) |

(52) U.S. Cl.
CPC ............. *H04B 1/04* (2013.01); *H03F 1/3241* (2013.01); *H04L 1/0003* (2013.01); *H04L 27/01* (2013.01); *H04L 1/0017* (2013.01); *H04L 2027/0038* (2013.01)

(58) Field of Classification Search
CPC ....... H04B 1/04; H03F 1/3241; H04L 1/0003; H04L 27/01; H04L 1/0017; H04L 2027/0038
See application file for complete search history.

(56) References Cited

U.S. PATENT DOCUMENTS

| | | | | |
|---|---|---|---|---|
| 2010/0061438 | A1* | 3/2010 | Tan | H04B 17/336 |
| | | | | 375/227 |
| 2021/0344367 | A1* | 11/2021 | Wolf | H04W 8/24 |
| 2022/0312403 | A1* | 9/2022 | Landis | H04W 8/24 |
| 2022/0353850 | A1 | 11/2022 | Landis et al. | |
| 2022/0393709 | A1 | 12/2022 | Kutz et al. | |
| 2022/0393734 | A1 | 12/2022 | Laufer et al. | |

OTHER PUBLICATIONS

International Search Report and Written Opinion—PCT/US2024/027202—ISA/EPO—Aug. 5, 2024.

* cited by examiner

*Primary Examiner* — Vineeta S Panwalkar
(74) *Attorney, Agent, or Firm* — Holland & Hart LLP

(57) ABSTRACT

Methods, systems, and devices for wireless communications are described. The described techniques may provide for an adaptive digital post-distortion (DPoD) procedure and reporting of modulation and coding scheme (MCS) indices for communications between a user equipment (UE) and a network entity. The UE may select a kernel from a set of kernels indicated by the network entity for a DPoD procedure based on a target error vector magnitude (EVM). Additionally, or alternatively, the UE may determine a limitation for an MCS index for the network entity to use in communications with the UE based on a power limitation of the UE and an EVM associated with the MCS. The network entity and the UE may accordingly communicate using the MCS limitation requested by the UE and the determined DPoD kernel.

30 Claims, 18 Drawing Sheets

ADAPTIVE DIGITAL POST-DISTORTION AND MODULATION AND CODING SCHEME INDEX REPORTING

FIELD OF TECHNOLOGY

The following relates to wireless communications, including adaptive digital post-distortion and modulation and coding scheme (MCS) index reporting.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal FDMA (OFDMA), or discrete Fourier transform spread orthogonal frequency division multiplexing (DFT-S-OFDM). A wireless multiple-access communications system may include one or more base stations, each supporting wireless communication for communication devices, which may be known as user equipment (UE).

SUMMARY

The described techniques relate to improved methods, systems, devices, and apparatuses that support adaptive digital post-distortion (DPoD) and modulation and coding scheme (MCS) index reporting. For example, the described techniques provide for an improved DPoD procedure and improved reporting of MCS indices for communications between a user equipment (UE) and a network entity. The network entity may transmit to the UE an indication multiple possible kernels for use in a DPoD procedure and one or more error vector magnitudes (EVMs) associated with each of the kernels. The UE may select a kernel from the table for the DPoD procedure based on a target EVM, and thus may reduce latency and power consumption. Additionally, or alternatively, the UE may determine a requested MCS index (e.g., setting, parameter) for the network entity to use in communications with the UE based on a power limitation of the UE. For example, if processing resources are limited, the UE may request that the network entity use an MCS with a relatively lower MCS index rather than an MCS with a relatively higher MCS index, which may be associated with a larger EVM and thus, a more complex DpoD kernel. The network entity may accordingly transmit downlink messages based on the MCS index indicated by the UE. The UE may receive the downlink messages and perform DpoD using the selected DpoD kernel.

A method for wireless communications at a UE is described. The method may include receiving an indication of a set of multiple DPoD kernels associated with a network entity, each DPoD kernel associated with one or more EVMs, selecting a DPoD kernel of the set of multiple DPoD kernels associated with the network entity based on a target EVM at the UE, transmitting an indication of an MCS index in accordance with the selected DPoD kernel and the target EVM, and receiving a downlink message based on the selected DPoD kernel and the indicated MCS index.

An apparatus for wireless communications at a UE is described. The apparatus may include a processor, memory coupled with the processor, and instructions stored in the memory. The instructions may be executable by the processor to cause the apparatus to receive an indication of a set of multiple DPoD kernels associated with a network entity, each DPoD kernel associated with one or more EVMs, select a DPoD kernel of the set of multiple DPoD kernels associated with the network entity based on a target EVM at the UE, transmit an indication of an MCS index in accordance with the selected DPoD kernel and the target EVM, and receive a downlink message based on the selected DPoD kernel and the indicated MCS index.

Another apparatus for wireless communications at a UE is described. The apparatus may include means for receiving an indication of a set of multiple DPoD kernels associated with a network entity, each DPoD kernel associated with one or more EVMs, means for selecting a DPoD kernel of the set of multiple DPoD kernels associated with the network entity based on a target EVM at the UE, means for transmitting an indication of an MCS index in accordance with the selected DPoD kernel and the target EVM, and means for receiving a downlink message based on the selected DPoD kernel and the indicated MCS index.

A non-transitory computer-readable medium storing code for wireless communications at a UE is described. The code may include instructions executable by a processor to receive an indication of a set of multiple DPoD kernels associated with a network entity, each DPoD kernel associated with one or more EVMs, select a DPoD kernel of the set of multiple DPoD kernels associated with the network entity based on a target EVM at the UE, transmit an indication of an MCS index in accordance with the selected DPoD kernel and the target EVM, and receive a downlink message based on the selected DPoD kernel and the indicated MCS index.

In some examples of the method, apparatuses, and non-transitory computer-readable medium described herein, selecting the DPoD kernel may include operations, features, means, or instructions for selecting the target EVM from the one or more EVMs based on an EVM threshold.

In some examples of the method, apparatuses, and non-transitory computer-readable medium described herein, the EVM threshold may be based on one or more of a modulation order, an MCS, a battery level of the UE, or any combination thereof.

Some examples of the method, apparatuses, and non-transitory computer-readable medium described herein may further include operations, features, means, or instructions for selecting the MCS index based on a signal-to-noise ratio associated with communications between the UE and a network entity, the indication of the set of multiple DPoD kernels, and a battery level the UE.

In some examples of the method, apparatuses, and non-transitory computer-readable medium described herein, the indication of the set of multiple DPoD kernels includes, for each DPoD kernel of the set of multiple DPoD kernels, an indication one or more corresponding EVMs.

In some examples of the method, apparatuses, and non-transitory computer-readable medium described herein, receiving the downlink message may include operations, features, means, or instructions for receiving the downlink message in accordance with a second MCS index that may be different from the indicated MCS index based on a priority of the downlink message.

Some examples of the method, apparatuses, and non-transitory computer-readable medium described herein may further include operations, features, means, or instructions for demodulating the downlink message based on the selected DPoD kernel and the indicated MCS index.

Some examples of the method, apparatuses, and non-transitory computer-readable medium described herein may further include operations, features, means, or instructions for transmitting a capability message indicating a capability of the UE to perform adaptive DPoD.

In some examples of the method, apparatuses, and non-transitory computer-readable medium described herein, receiving the indication of the set of multiple DPoD kernels may include operations, features, means, or instructions for receiving a medium access control-control element (MAC-CE) or a radio resource control (RRC) message indicating the set of multiple DPoD kernels.

A method for wireless communications at a network entity is described. The method may include transmitting an indication of a set of multiple DPoD kernels associated with the network entity, each DPoD kernel associated with one or more EVMs, receiving an indication of an MCS index in accordance with a DPoD kernel of the set of multiple DPoD kernels and a target EVM, and transmitting a downlink message based on the MCS index.

An apparatus for wireless communications at a network entity is described. The apparatus may include a processor, memory coupled with the processor, and instructions stored in the memory. The instructions may be executable by the processor to cause the apparatus to transmit an indication of a set of multiple DPoD kernels associated with the network entity, each DPoD kernel associated with one or more EVMs, receive an indication of an MCS index in accordance with a DPoD kernel of the set of multiple DPoD kernels and a target EVM, and transmit a downlink message based on the MCS index.

Another apparatus for wireless communications at a network entity is described. The apparatus may include means for transmitting an indication of a set of multiple DPoD kernels associated with the network entity, each DPoD kernel associated with one or more EVMs, means for receiving an indication of an MCS index in accordance with a DPoD kernel of the set of multiple DPoD kernels and a target EVM, and means for transmitting a downlink message based on the MCS index.

A non-transitory computer-readable medium storing code for wireless communications at a network entity is described. The code may include instructions executable by a processor to transmit an indication of a set of multiple DPoD kernels associated with the network entity, each DPoD kernel associated with one or more EVMs, receive an indication of an MCS index in accordance with a DPoD kernel of the set of multiple DPoD kernels and a target EVM, and transmit a downlink message based on the MCS index.

In some examples of the method, apparatuses, and non-transitory computer-readable medium described herein, the indication of the set of multiple DPoD kernels includes, for each DPoD kernel of the set of multiple DPoD kernels, an indication one or more corresponding EVMs.

In some examples of the method, apparatuses, and non-transitory computer-readable medium described herein, transmitting the downlink message may include operations, features, means, or instructions for transmitting the downlink message in accordance with a second MCS index that may be different from the indicated MCS index based on a priority of the downlink message.

Some examples of the method, apparatuses, and non-transitory computer-readable medium described herein may further include operations, features, means, or instructions for receiving a capability message indicating a capability of a UE to perform adaptive DPoD.

In some examples of the method, apparatuses, and non-transitory computer-readable medium described herein, transmitting the indication of the set of multiple DPoD kernels may include operations, features, means, or instructions for transmitting a MAC-CE or an RRC message indicating the set of multiple DPoD kernels.

Some examples of the method, apparatuses, and non-transitory computer-readable medium described herein may further include operations, features, means, or instructions for performing a calibration procedure to obtain the set of multiple post-distortion kernels associated with each of the one or more EVMs and generating the set of multiple DPoD kernels and the one or more EVMs based on the calibration procedure.

In some examples of the method, apparatuses, and non-transitory computer-readable medium described herein, performing the calibration procedure may include operations, features, means, or instructions for inputting a signal into one or more power amplifiers, where a transmission power of the signal may be a same transmission power at which the network entity operates, generating a least square estimator based on the input signal, an output signal from the one or more power amplifiers, and one or more DPoD kernels, calculating an output of the one or more power amplifiers in accordance with the least square estimator, and measuring an EVM using the output signal and the output of the one or more power amplifiers.

Some examples of the method, apparatuses, and non-transitory computer-readable medium described herein may further include operations, features, means, or instructions for selecting a DPoD kernel corresponding to an EVM, where a size of the DPoD kernel may be less than a size of a second DPoD kernel corresponding to the EVM.

DETAILED DESCRIPTION

Figure 1:
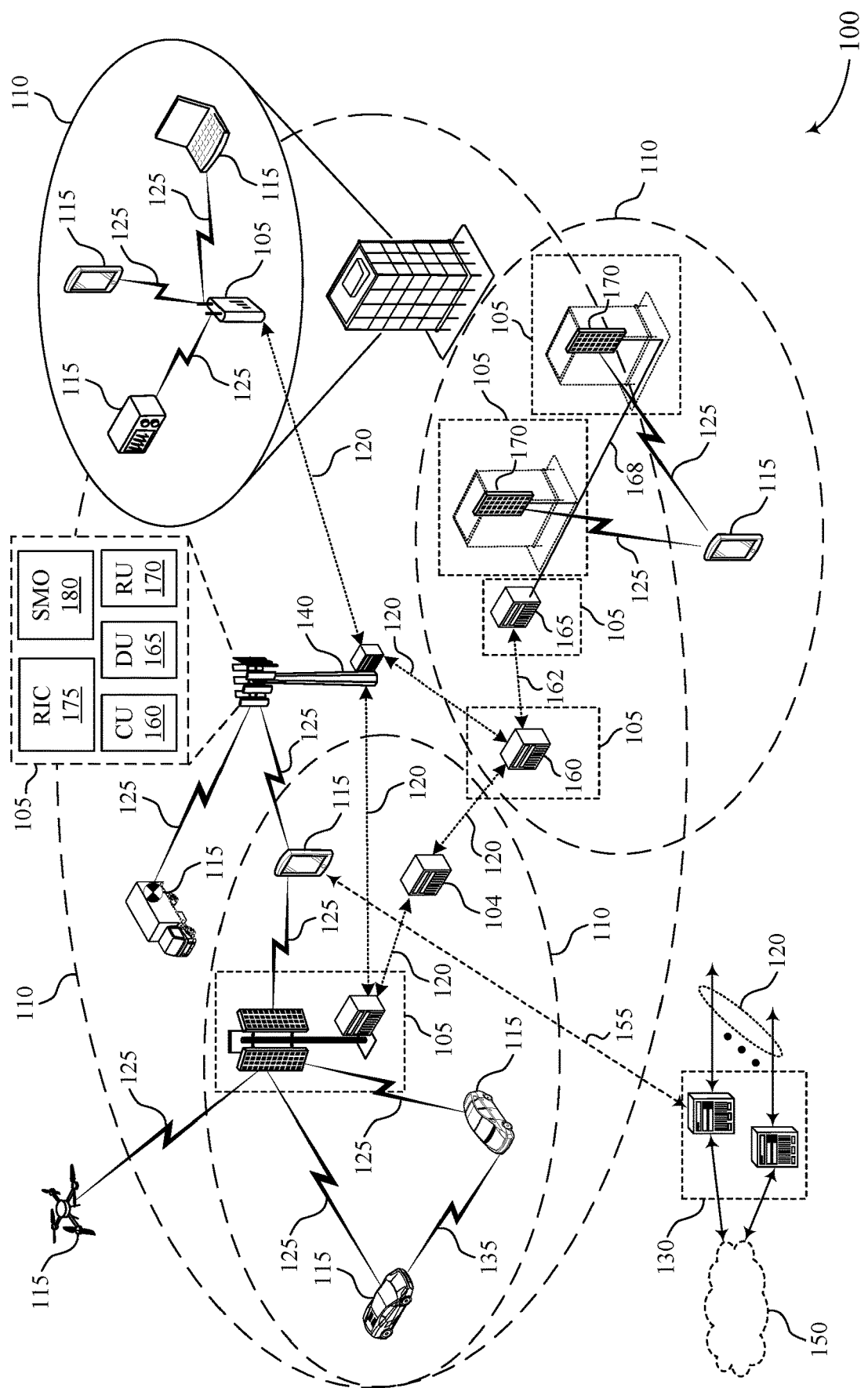
FIG. 1 shows an example of a wireless communications system that supports adaptive digital post-distortion (DpoD) and modulation and coding scheme (MCS) index reporting in accordance with one or more aspects of the present disclosure.

In some wireless communication systems, a network entity may use a power amplifier (PA) in communications with one or more user equipment (UEs). The PA may amplify the power of signals transmitted from the network entity non-linearly, which may limit an achievable signal-to-noise ratio (SNR) and therefore may limit an attainable data rate of the wireless communication system. To mitigate this non-linearity, the network entity may apply a digital pre-distortion (DPD) to a downlink shared channel to increase linearity of the signal power. That is, the network entity may apply inverse distortion to an input signal of the PA to cancel the distortion generated by the PA. However, applying the DPD may be a complex process, and performing DPD for each PA at each transmission antenna of the network entity may result in increased processing and power consumption.

To mitigate the cost of compensating for PA non-linearities at the network entity side, a UE may instead compensate for the non-linearities of the PA of the network entity by applying digital post-distortion (DpoD) to signals received from the network entity. In the DpoD procedure, the UE may generate a model (e.g., a polynomial) of the PA of the network entity including a kernel (e.g., a set of terms, such as coefficients or filter taps) to apply to signals transmitted from the network entity to mitigate the non-linearity impairment. The kernel may include a relatively larger quantity of terms or terms with a relatively higher order, which may increase an error vector magnitude (EVM) and thus result in a more accurate DpoD procedure. However, if the kernel has many terms or high order terms, the processing associated with performing the DpoD procedure may result in increased latency and power consumption at the UE.

Accordingly, techniques described herein may support an improved DpoD procedure and improved reporting of modulation and coding scheme (MCS) indices for communications between a UE and a network entity. For example, the network entity may transmit, to the UE, an indication of multiple possible kernels for use in a DpoD procedure and EVMs associated with each of the kernels. For example, the network entity may transmit a table of the multiple possible kernels and associated EVMs to the UE. The UE may select a kernel from the multiple possible kernels for the DPoD procedure based on a target EVM, and thus may reduce latency and power consumption. For example, the UE may determine that some communications with the network entity may be performed with a relatively larger non-linearity impairment (e.g., and thus a relatively smaller EVM) than some other communications, which may be performed with a relatively smaller non-linearity impairment (e.g., and a relatively larger EVM). The UE may accordingly select a smaller (e.g., shorter or lower order) kernel associated with a smaller EVM for at least some communications with the network entity, which may reduce latency and power consumption at the UE.

Additionally, or alternatively, the UE may determine an MCS index (e.g., a limitation for the MCS index) for the network entity to use in communications with the UE based on a power limitation of the UE. For example, the UE may save power by applying a kernel associated with a relatively lower EVM. However, communications using an MCS with a relatively higher MCS index may be associated with a larger EVM than communications using an MCS with a relatively lower MCS index. Thus, the UE may request that the network entity use an MCS with a relatively lower MCS index rather than an MCS with a relatively higher MCS index for communications with the UE. The network entity may accordingly transmit downlink messages using the MCS index indicated by the UE. The UE may receive the downlink messages and perform DPoD using the determined kernel.

Aspects of the disclosure are initially described in the context of wireless communications systems. Aspects of the disclosure are further illustrated by and described with reference to power usage diagrams and process flow diagrams. Aspects of the disclosure are further illustrated by and described with reference to apparatus diagrams, system diagrams, and flowcharts that relate to adaptive DPoD and MCS index reporting.

FIG. 1 shows an example of a wireless communications system 100 that supports adaptive DPoD and MCS index reporting in accordance with one or more aspects of the present disclosure. The wireless communications system 100 may include one or more network entities 105, one or more UEs 115, and a core network 130. In some examples, the wireless communications system 100 may be a Long Term Evolution (LTE) network, an LTE-Advanced (LTE-A) network, an LTE-A Pro network, a New Radio (NR) network, or a network operating in accordance with other systems and radio technologies, including future systems and radio technologies not explicitly mentioned herein.

The network entities 105 may be dispersed throughout a geographic area to form the wireless communications system 100 and may include devices in different forms or having different capabilities. In various examples, a network entity 105 may be referred to as a network element, a mobility element, a radio access network (RAN) node, or network equipment, among other nomenclature. In some examples, network entities 105 and UEs 115 may wirelessly communicate via one or more communication links 125 (e.g., a radio frequency (RF) access link). For example, a network entity 105 may support a coverage area 110 (e.g., a geographic coverage area) over which the UEs 115 and the network entity 105 may establish one or more communication links 125. The coverage area 110 may be an example of a geographic area over which a network entity 105 and a UE 115 may support the communication of signals according to one or more radio access technologies (RATs).

The UEs 115 may be dispersed throughout a coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be capable of supporting communications with various types of devices, such as other UEs 115 or network entities 105, as shown in FIG. 1.

As described herein, a node of the wireless communications system 100, which may be referred to as a network node, or a wireless node, may be a network entity 105 (e.g., any network entity described herein), a UE 115 (e.g., any UE described herein), a network controller, an apparatus, a device, a computing system, one or more components, or another suitable processing entity configured to perform any of the techniques described herein. For example, a node may be a UE 115. As another example, a node may be a network entity 105. As another example, a first node may be configured to communicate with a second node or a third node. In one aspect of this example, the first node may be a UE 115, the second node may be a network entity 105, and the third node may be a UE 115. In another aspect of this example, the first node may be a UE 115, the second node may be a network entity 105, and the third node may be a network entity 105. In yet other aspects of this example, the first, second, and third nodes may be different relative to these examples. Similarly, reference to a UE 115, network entity 105, apparatus, device, computing system, or the like may include disclosure of the UE 115, network entity 105, apparatus, device, computing system, or the like being a node. For example, disclosure that a UE 115 is configured to receive information from a network entity 105 also discloses that a first node is configured to receive information from a second node.

In some examples, network entities 105 may communicate with the core network 130, or with one another, or both. For example, network entities 105 may communicate with the core network 130 via one or more backhaul communication links 120 (e.g., in accordance with an S1, N2, N3, or other interface protocol). In some examples, network entities 105 may communicate with one another via a backhaul communication link 120 (e.g., in accordance with an X2, Xn, or other interface protocol) either directly (e.g., directly between network entities 105) or indirectly (e.g., via a core network 130). In some examples, network entities 105 may communicate with one another via a midhaul communication link 162 (e.g., in accordance with a midhaul interface protocol) or a fronthaul communication link 168 (e.g., in accordance with a fronthaul interface protocol), or any combination thereof. The backhaul communication links 120, midhaul communication links 162, or fronthaul communication links 168 may be or include one or more wired links (e.g., an electrical link, an optical fiber link), one or more wireless links (e.g., a radio link, a wireless optical link), among other examples or various combinations thereof. A UE 115 may communicate with the core network 130 via a communication link 155.

One or more of the network entities 105 described herein may include or may be referred to as a base station 140 (e.g., a base transceiver station, a radio base station, an NR base station, an access point, a radio transceiver, a NodeB, an eNodeB (eNB), a next-generation NodeB or a giga-NodeB (either of which may be referred to as a gNB), a 5G NB, a next-generation eNB (ng-eNB), a Home NodeB, a Home eNodeB, or other suitable terminology). In some examples, a network entity 105 (e.g., a base station 140) may be implemented in an aggregated (e.g., monolithic, standalone) base station architecture, which may be configured to utilize a protocol stack that is physically or logically integrated within a single network entity 105 (e.g., a single RAN node, such as a base station 140).

In some examples, a network entity 105 may be implemented in a disaggregated architecture (e.g., a disaggregated base station architecture, a disaggregated RAN architecture), which may be configured to utilize a protocol stack that is physically or logically distributed among two or more network entities 105, such as an integrated access backhaul (IAB) network, an open RAN (O-RAN) (e.g., a network configuration sponsored by the O-RAN Alliance), or a virtualized RAN (vRAN) (e.g., a cloud RAN (C-RAN)). For example, a network entity 105 may include one or more of a central unit (CU) 160, a distributed unit (DU) 165, a radio unit (RU) 170, a RAN Intelligent Controller (RIC) 175 (e.g., a Near-Real Time RIC (Near-RT RIC), a Non-Real Time RIC (Non-RT RIC)), a Service Management and Orchestration (SMO) 180 system, or any combination thereof. An RU 170 may also be referred to as a radio head, a smart radio head, a remote radio head (RRH), a remote radio unit (RRU), or a transmission reception point (TRP). One or more components of the network entities 105 in a disaggregated RAN architecture may be co-located, or one or more components of the network entities 105 may be located in distributed locations (e.g., separate physical locations). In some examples, one or more network entities 105 of a disaggregated RAN architecture may be implemented as virtual units (e.g., a virtual CU (VCU), a virtual DU (VDU), a virtual RU (VRU)).

The split of functionality between a CU 160, a DU 165, and an RU 170 is flexible and may support different functionalities depending on which functions (e.g., network layer functions, protocol layer functions, baseband functions, RF functions, and any combinations thereof) are performed at a CU 160, a DU 165, or an RU 170. For example, a functional split of a protocol stack may be employed between a CU 160 and a DU 165 such that the CU 160 may support one or more layers of the protocol stack and the DU 165 may support one or more different layers of the protocol stack. In some examples, the CU 160 may host upper protocol layer (e.g., layer 3 (L3), layer 2 (L2)) functionality and signaling (e.g., Radio Resource Control (RRC), service data adaption protocol (SDAP), Packet Data Convergence Protocol (PDCP)). The CU 160 may be connected to one or more DUs 165 or RUs 170, and the one or more DUs 165 or RUs 170 may host lower protocol layers, such as layer 1 (L1) (e.g., physical (PHY) layer) or L2 (e.g., radio link control (RLC) layer, medium access control (MAC) layer) functionality and signaling, and may each be at least partially controlled by the CU 160. Additionally, or alternatively, a functional split of the protocol stack may be employed between a DU 165 and an RU 170 such that the DU 165 may support one or more layers of the protocol stack and the RU 170 may support one or more different layers of the protocol stack. The DU 165 may support one or multiple different cells (e.g., via one or more RUs 170). In some cases, a functional split between a CU 160 and a DU 165, or between a DU 165 and an RU 170 may be within a protocol layer (e.g., some functions for a protocol layer may be performed by one of a CU 160, a DU 165, or an RU 170, while other functions of the protocol layer are performed by a different one of the CU 160, the DU 165, or the RU 170). A CU 160 may be functionally split further into CU control plane (CU-CP) and CU user plane (CU-UP) functions. A CU 160 may be connected to one or more DUs 165 via a midhaul communication link 162 (e.g., F1, F1-c, F1-u), and a DU 165 may be connected to one or more RUs 170 via a fronthaul communication link 168 (e.g., open fronthaul (FH) interface). In some examples, a midhaul communication link 162 or a fronthaul communication link 168 may be implemented in accordance with an interface (e.g., a channel) between layers of a protocol stack supported by respective network entities 105 that are in communication via such communication links.

In wireless communications systems (e.g., wireless communications system 100), infrastructure and spectral resources for radio access may support wireless backhaul link capabilities to supplement wired backhaul connections, providing an IAB network architecture (e.g., to a core network 130). In some cases, in an IAB network, one or more network entities 105 (e.g., IAB nodes 104) may be partially controlled by each other. One or more IAB nodes 104 may be referred to as a donor entity or an IAB donor. One or more DUs 165 or one or more RUs 170 may be partially controlled by one or more CUs 160 associated with a donor network entity 105 (e.g., a donor base station 140). The one or more donor network entities 105 (e.g., IAB donors) may be in communication with one or more additional network entities 105 (e.g., IAB nodes 104) via supported access and backhaul links (e.g., backhaul communication links 120). IAB nodes 104 may include an IAB mobile termination (IAB-MT) controlled (e.g., scheduled) by DUs 165 of a coupled IAB donor. An IAB-MT may include an independent set of antennas for relay of communications with UEs 115, or may share the same antennas (e.g., of an RU 170) of an IAB node 104 used for access via the DU 165 of the IAB node 104 (e.g., referred to as virtual IAB-MT (vIAB-MT)). In some examples, the IAB nodes 104 may include DUs 165 that support communication links with additional entities (e.g., IAB nodes 104, UEs 115) within the relay chain or configuration of the access network (e.g., downstream). In such cases, one or more components of the disaggregated RAN architecture (e.g., one or more IAB nodes 104 or components of IAB nodes 104) may be configured to operate according to the techniques described herein.

In the case of the techniques described herein applied in the context of a disaggregated RAN architecture, one or more components of the disaggregated RAN architecture may be configured to support adaptive DPoD and MCS index reporting as described herein. For example, some operations described as being performed by a UE 115 or a network entity 105 (e.g., a base station 140) may additionally, or alternatively, be performed by one or more components of the disaggregated RAN architecture (e.g., IAB nodes 104, DUs 165, CUs 160, RUs 170, RIC 175, SMO 180).

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a tablet computer, a laptop computer, or a personal computer. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples.

The UEs 115 described herein may be able to communicate with various types of devices, such as other UEs 115 that may sometimes act as relays as well as the network entities 105 and the network equipment including macro eNBs or gNBs, small cell eNBs or gNBs, or relay base stations, among other examples, as shown in FIG. 1.

The UEs 115 and the network entities 105 may wirelessly communicate with one another via one or more communication links 125 (e.g., an access link) using resources associated with one or more carriers. The term "carrier" may refer to a set of RF spectrum resources having a defined physical layer structure for supporting the communication links 125. For example, a carrier used for a communication link 125 may include a portion of a RF spectrum band (e.g., a bandwidth part (BWP)) that is operated according to one or more physical layer channels for a given radio access technology (e.g., LTE, LTE-A, LTE-A Pro, NR). Each physical layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers. Communication between a network entity 105 and other devices may refer to communication between the devices and any portion (e.g., entity, sub-entity) of a network entity 105. For example, the terms "transmitting," "receiving," or "communicating," when referring to a network entity 105, may refer to any portion of a network entity 105 (e.g., a base station 140, a CU 160, a DU 165, a RU 170) of a RAN communicating with another device (e.g., directly or via one or more other network entities 105).

Signal waveforms transmitted via a carrier may be made up of multiple subcarriers (e.g., using multi-carrier modulation (MCM) techniques such as orthogonal frequency division multiplexing (OFDM) or discrete Fourier transform spread OFDM (DFT-S-OFDM)). In a system employing MCM techniques, a resource element may refer to resources of one symbol period (e.g., a duration of one modulation symbol) and one subcarrier, in which case the symbol period and subcarrier spacing may be inversely related. The quantity of bits carried by each resource element may depend on the modulation scheme (e.g., the order of the modulation scheme, the coding rate of the modulation scheme, or both), such that a relatively higher quantity of resource elements (e.g., in a transmission duration) and a relatively higher order of a modulation scheme may correspond to a relatively higher rate of communication. A wireless communications resource may refer to a combination of an RF spectrum resource, a time resource, and a spatial resource (e.g., a spatial layer, a beam), and the use of multiple spatial resources may increase the data rate or data integrity for communications with a UE 115.

The time intervals for the network entities 105 or the UEs 115 may be expressed in multiples of a basic time unit which may, for example, refer to a sampling period of $T_s=1/(\Delta f_{max} \cdot N_f)$ seconds, for which $\Delta f_{max}$ may represent a supported subcarrier spacing, and $N_f$ may represent a supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively-numbered subframes or slots, and each subframe or slot may have the same duration. In some examples, a frame may be divided (e.g., in the time domain) into subframes, and each subframe may be further divided into a quantity of slots. Alternatively, each frame may include a variable quantity of slots, and the quantity of slots may depend on subcarrier spacing. Each slot may include a quantity of symbol periods (e.g., depending on the length of the cyclic prefix prepended to each symbol period). In some wireless communications systems 100, a slot may further be divided into multiple mini-slots associated with one or more symbols. Excluding the cyclic prefix, each symbol period may be associated with one or more (e.g., $N_f$) sampling periods. The duration of a symbol period may depend on the subcarrier spacing or frequency band of operation.

A subframe, a slot, a mini-slot, or a symbol may be the smallest scheduling unit (e.g., in the time domain) of the wireless communications system 100 and may be referred to as a transmission time interval (TTI). In some examples, the TTI duration (e.g., a quantity of symbol periods in a TTI) may be variable. Additionally, or alternatively, the smallest scheduling unit of the wireless communications system 100 may be dynamically selected (e.g., in bursts of shortened TTIs (sTTIs)).

Physical channels may be multiplexed for communication using a carrier according to various techniques. A physical control channel and a physical data channel may be multiplexed for signaling via a downlink carrier, for example, using one or more of time division multiplexing (TDM) techniques, frequency division multiplexing (FDM) techniques, or hybrid TDM-FDM techniques. A control region (e.g., a control resource set (CORESET)) for a physical control channel may be defined by a set of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to an amount of control channel resources (e.g., control channel elements (CCEs)) associated with encoded information for a control information format having a given payload size. Search space sets may include common search space sets configured for sending control information to multiple UEs 115 and UE-specific search space sets for sending control information to a specific UE 115.

A network entity 105 may provide communication coverage via one or more cells, for example a macro cell, a small cell, a hot spot, or other types of cells, or any combination thereof. The term "cell" may refer to a logical communication entity used for communication with a network entity 105 (e.g., using a carrier) and may be associated with an identifier for distinguishing neighboring cells (e.g., a physical cell identifier (PCID), a virtual cell identifier (VCID), or others). In some examples, a cell also may refer to a coverage area 110 or a portion of a coverage area 110 (e.g., a sector) over which the logical communication entity operates. Such cells may range from smaller areas (e.g., a structure, a subset of structure) to larger areas depending on various factors such as the capabilities of the network entity 105. For example, a cell may be or include a building, a subset of a building, or exterior spaces between or overlapping with coverage areas 110, among other examples.

A macro cell generally covers a relatively large geographic area (e.g., several kilometers in radius) and may allow unrestricted access by the UEs 115 with service subscriptions with the network provider supporting the macro cell. A small cell may be associated with a lower-powered network entity 105 (e.g., a lower-powered base station 140), as compared with a macro cell, and a small cell may operate using the same or different (e.g., licensed, unlicensed) frequency bands as macro cells. Small cells may provide unrestricted access to the UEs 115 with service subscriptions with the network provider or may provide restricted access to the UEs 115 having an association with the small cell (e.g., the UEs 115 in a closed subscriber group (CSG), the UEs 115 associated with users in a home or office). A network entity 105 may support one or multiple cells and may also support communications via the one or more cells using one or multiple component carriers.

In some examples, a carrier may support multiple cells, and different cells may be configured according to different protocol types (e.g., MTC, narrowband IoT (NB-IoT), enhanced mobile broadband (eMBB)) that may provide access for different types of devices.

In some examples, a network entity 105 (e.g., a base station 140, an RU 170) may be movable and therefore provide communication coverage for a moving coverage area 110. In some examples, different coverage areas 110 associated with different technologies may overlap, but the different coverage areas 110 may be supported by the same network entity 105. In some other examples, the overlapping coverage areas 110 associated with different technologies may be supported by different network entities 105. The wireless communications system 100 may include, for example, a heterogeneous network in which different types of the network entities 105 provide coverage for various coverage areas 110 using the same or different radio access technologies.

The wireless communications system 100 may be configured to support ultra-reliable communications or low-latency communications, or various combinations thereof. For example, the wireless communications system 100 may be configured to support ultra-reliable low-latency communications (URLLC). The UEs 115 may be designed to support ultra-reliable, low-latency, or critical functions. Ultra-reliable communications may include private communication or group communication and may be supported by one or more services such as push-to-talk, video, or data. Support for ultra-reliable, low-latency functions may include prioritization of services, and such services may be used for public safety or general commercial applications. The terms ultra-reliable, low-latency, and ultra-reliable low-latency may be used interchangeably herein.

In some examples, a UE 115 may be configured to support communicating directly with other UEs 115 via a device-to-device (D2D) communication link 135 (e.g., in accordance with a peer-to-peer (P2P), D2D, or sidelink protocol). In some examples, one or more UEs 115 of a group that are performing D2D communications may be within the coverage area 110 of a network entity 105 (e.g., a base station 140, an RU 170), which may support aspects of such D2D communications being configured by (e.g., scheduled by) the network entity 105. In some examples, one or more UEs 115 of such a group may be outside the coverage area 110 of a network entity 105 or may be otherwise unable to or not configured to receive transmissions from a network entity 105. In some examples, groups of the UEs 115 communicating via D2D communications may support a one-to-many (1:M) system in which each UE 115 transmits to each of the other UEs 115 in the group. In some examples, a network entity 105 may facilitate the scheduling of resources for D2D communications. In some other examples, D2D communications may be carried out between the UEs 115 without an involvement of a network entity 105.

The core network 130 may provide user authentication, access authorization, tracking, Internet Protocol (IP) connectivity, and other access, routing, or mobility functions. The core network 130 may be an evolved packet core (EPC) or 5G core (5GC), which may include at least one control plane entity that manages access and mobility (e.g., a mobility management entity (MME), an access and mobility management function (AMF)) and at least one user plane entity that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the network entities 105 (e.g., base stations 140) associated with the core network 130. User IP packets may be transferred through the user plane entity, which may provide IP address allocation as well as other functions. The user plane entity may be connected to IP services 150 for one or more network operators. The IP services 150 may include access to the Internet, Intranet(s), an IP Multimedia Subsystem (IMS), or a Packet-Switched Streaming Service.

The wireless communications system 100 may operate using one or more frequency bands, which may be in the range of 300 megahertz (MHz) to 300 gigahertz (GHz). Generally, the region from 300 MHz to 3 GHz is known as the ultra-high frequency (UHF) region or decimeter band because the wavelengths range from approximately one decimeter to one meter in length. UHF waves may be blocked or redirected by buildings and environmental features, which may be referred to as clusters, but the waves may penetrate structures sufficiently for a macro cell to provide service to the UEs 115 located indoors. Communications using UHF waves may be associated with smaller antennas and shorter ranges (e.g., less than 100 kilometers) compared to communications using the smaller frequencies and longer waves of the high frequency (HF) or very high frequency (VHF) portion of the spectrum below 300 MHz.

The wireless communications system 100 may utilize both licensed and unlicensed RF spectrum bands. For example, the wireless communications system 100 may employ License Assisted Access (LAA), LTE-Unlicensed (LTE-U) radio access technology, or NR technology using an unlicensed band such as the 5 GHz industrial, scientific, and medical (ISM) band. While operating using unlicensed RF spectrum bands, devices such as the network entities 105 and the UEs 115 may employ carrier sensing for collision detection and avoidance. In some examples, operations using unlicensed bands may be based on a carrier aggregation configuration in conjunction with component carriers operating using a licensed band (e.g., LAA). Operations using unlicensed spectrum may include downlink transmissions, uplink transmissions, P2P transmissions, or D2D transmissions, among other examples.

A network entity 105 (e.g., a base station 140, an RU 170) or a UE 115 may be equipped with multiple antennas, which may be used to employ techniques such as transmit diversity, receive diversity, multiple-input multiple-output (MIMO) communications, or beamforming. The antennas of a network entity 105 or a UE 115 may be located within one or more antenna arrays or antenna panels, which may support MIMO operations or transmit or receive beamforming. For example, one or more base station antennas or antenna arrays may be co-located at an antenna assembly, such as an antenna tower. In some examples, antennas or antenna arrays associated with a network entity 105 may be located at diverse geographic locations. A network entity 105 may include an antenna array with a set of rows and columns of antenna ports that the network entity 105 may use to support beamforming of communications with a UE 115. Likewise, a UE 115 may include one or more antenna arrays that may support various MIMO or beamforming operations. Additionally, or alternatively, an antenna panel may support RF beamforming for a signal transmitted via an antenna port.

Beamforming, which may also be referred to as spatial filtering, directional transmission, or directional reception, is a signal processing technique that may be used at a transmitting device or a receiving device (e.g., a network entity 105, a UE 115) to shape or steer an antenna beam (e.g., a transmit beam, a receive beam) along a spatial path between the transmitting device and the receiving device. Beamforming may be achieved by combining the signals communicated via antenna elements of an antenna array such that some signals propagating along particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

A network entity 105 or a UE 115 may use beam sweeping techniques as part of beamforming operations. For example, a network entity 105 (e.g., a base station 140, an RU 170) may use multiple antennas or antenna arrays (e.g., antenna panels) to conduct beamforming operations for directional communications with a UE 115. Some signals (e.g., synchronization signals, reference signals, beam selection signals, or other control signals) may be transmitted by a network entity 105 multiple times along different directions. For example, the network entity 105 may transmit a signal according to different beamforming weight sets associated with different directions of transmission. Transmissions along different beam directions may be used to identify (e.g., by a transmitting device, such as a network entity 105, or by a receiving device, such as a UE 115) a beam direction for later transmission or reception by the network entity 105.

Some signals, such as data signals associated with a particular receiving device, may be transmitted by transmitting device (e.g., a transmitting network entity 105, a transmitting UE 115) along a single beam direction (e.g., a direction associated with the receiving device, such as a receiving network entity 105 or a receiving UE 115). In some examples, the beam direction associated with transmissions along a single beam direction may be determined based on a signal that was transmitted along one or more beam directions. For example, a UE 115 may receive one or more of the signals transmitted by the network entity 105 along different directions and may report to the network entity 105 an indication of the signal that the UE 115 received with a highest signal quality or an otherwise acceptable signal quality.

In some examples, transmissions by a device (e.g., by a network entity 105 or a UE 115) may be performed using multiple beam directions, and the device may use a combination of digital precoding or beamforming to generate a combined beam for transmission (e.g., from a network entity 105 to a UE 115). The UE 115 may report feedback that indicates precoding weights for one or more beam directions, and the feedback may correspond to a configured set of beams across a system bandwidth or one or more sub-bands. The network entity 105 may transmit a reference signal (e.g., a cell-specific reference signal (CRS), a channel state information reference signal (CSI-RS)), which may be precoded or unprecoded. The UE 115 may provide feedback for beam selection, which may be a precoding matrix indicator (PMI) or codebook-based feedback (e.g., a multi-panel type codebook, a linear combination type codebook, a port selection type codebook). Although these techniques are described with reference to signals transmitted along one or more directions by a network entity 105 (e.g., a base station 140, an RU 170), a UE 115 may employ similar techniques for transmitting signals multiple times along different directions (e.g., for identifying a beam direction for subsequent transmission or reception by the UE 115) or for transmitting a signal along a single direction (e.g., for transmitting data to a receiving device).

A receiving device (e.g., a UE 115) may perform reception operations in accordance with multiple receive configurations (e.g., directional listening) when receiving various signals from a receiving device (e.g., a network entity 105), such as synchronization signals, reference signals, beam selection signals, or other control signals. For example, a receiving device may perform reception in accordance with multiple receive directions by receiving via different antenna subarrays, by processing received signals according to different antenna subarrays, by receiving according to different receive beamforming weight sets (e.g., different directional listening weight sets) applied to signals received at multiple antenna elements of an antenna array, or by processing received signals according to different receive beamforming weight sets applied to signals received at multiple antenna elements of an antenna array, any of which may be referred to as "listening" according to different receive configurations or receive directions. In some examples, a receiving device may use a single receive configuration to receive along a single beam direction (e.g., when receiving a data signal). The single receive configuration may be aligned along a beam direction determined based on listening according to different receive configuration directions (e.g., a beam direction determined to have a highest signal strength, highest signal-to-noise ratio (SNR), or otherwise acceptable signal quality based on listening according to multiple beam directions).

Techniques described herein may provide for an improved DPoD procedure and improved reporting of MCS index limitations for communications between a UE 115 and a network entity 105. The network entity 105 may transmit, to a UE, an indication multiple possible kernels for use in a DPoD procedure and EVMs associated with each of the kernels. The UE 115 may select a kernel from the multiple possible kernels for the DPoD procedure based on a target EVM, and thus may reduce latency and power consumption.

Additionally, or alternatively, the UE 115 may determine a requested MCS index (e.g., a limitation for the MCS index) for the network entity 105 to use in communications with the UE 115 based on a power limitation of the UE 115. For example, the UE 115 may request that the network entity 105 use an MCS with a relatively lower MCS index rather than an MCS with a relatively higher MCS index, which may be associated with a larger EVM and thus, a more complex DPoD kernel. The network entity 105 may accordingly transmit downlink messages using the MCS index indicated by the UE 115. The UE 115 may receive the downlink messages and perform DPoD using the determined DPoD kernel.

Figure 2:
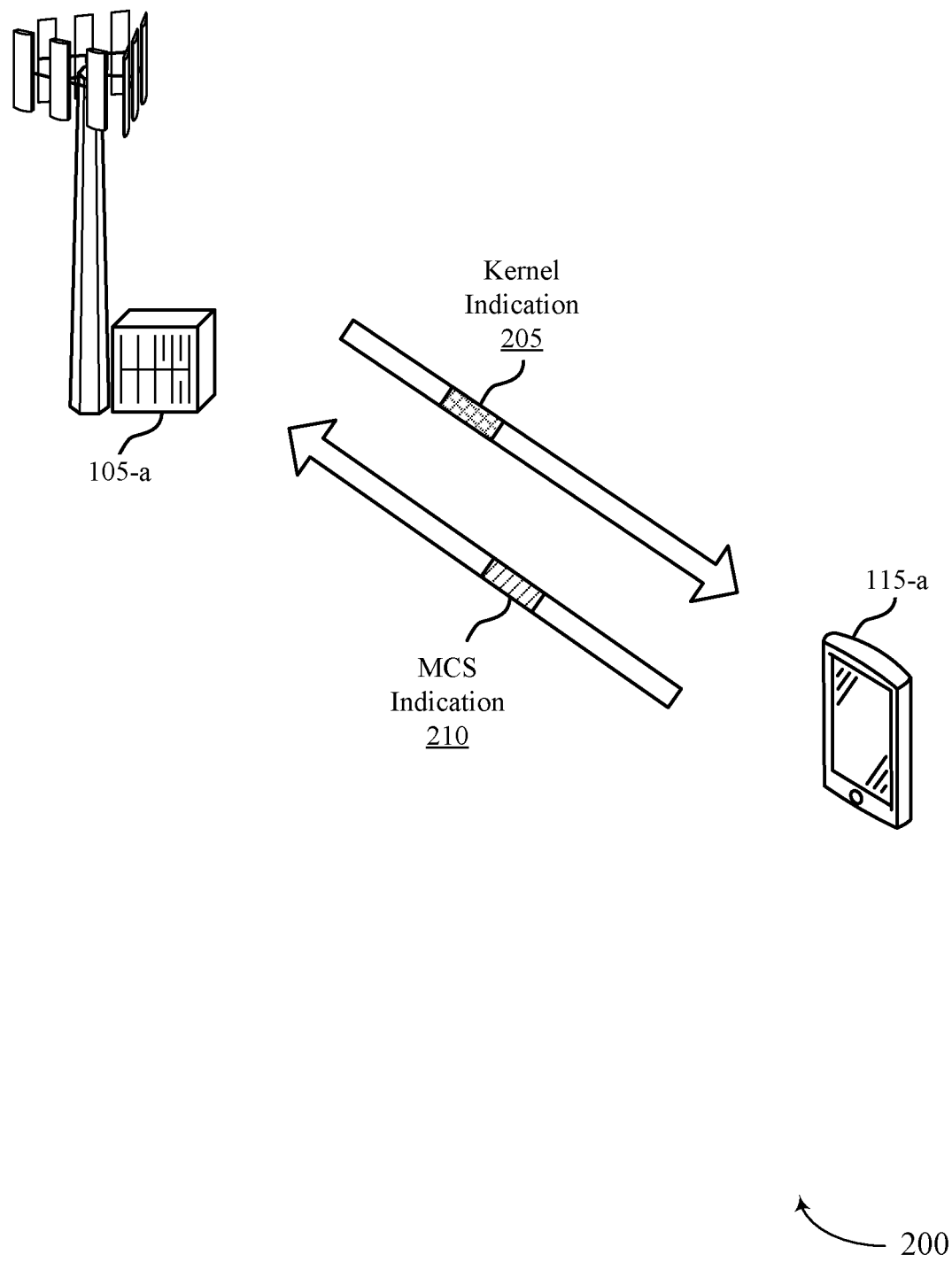
FIG. 2 shows an example of a wireless communications system that supports adaptive DpoD and MCS index reporting in accordance with one or more aspects of the present disclosure.

FIG. 2 shows an example of a wireless communications system 200 that supports adaptive DPoD and MCS index reporting in accordance with one or more aspects of the present disclosure. In some cases, the wireless communications system 200 may implement or be implemented by aspects of the wireless communications system 100. For example, the wireless communications system 200 may include a UE 115-a and a network entity 105-a, which may be examples of the corresponding devices as described with reference to FIG. 1.

In some wireless communication systems, a network entity 105-a may use a PA in communications with one or more UEs 115 (e.g., a UE 115-a). The PA may amplify the power of signals transmitted from the network entity 105-a non-linearly, which may result in a radio frequency (RF) impairment. The RF impairment may limit an achievable SNR and therefore, may limit an attainable data rate of the system. To mitigate this impairment, the network entity 105-a may apply a DPD to a downlink shared channel to increase signal power linearity. That is, the network entity 105-a may apply inverse distortion to an input signal of the PA to cancel distortion generated by the PA. However, applying the DPD may be a complex process, and a DPD correction unit for each PA at each transmission antenna of the network entity 105-a may be associated with a high cost due to a complex RF feedback chain (e.g., including a mixer, a low-pass filter (LPF), an automatic gain control (AGC) unit, and an analog to digital converter (ADC) at each PA).

Thus, to mitigate the cost at the network entity 105-a, a receiving device (e.g., the UE 115-a) may apply the inverse distortion rather than a transmitting device (e.g., the network entity 105-a). That is, the UE 115-a (instead of the network entity 105-a) may perform PA estimation and non-linearity impairment correction via a DPoD process. To perform a DPoD procedure, the UE 115-a may generate a PA model (e.g., a polynomial) including a set of terms (representing a kernel) for application to signals transmitted from the network entity 105-a to mitigate the non-linearity impairment. For example, the UE 115-a may estimate non-linearity characteristics as a polynomial (e.g., a finite degree polynomial) via a DPoD algorithm. In some examples, the UE 115-a may estimate a polynomial such as Equation 1, which may exclude memory components.

$$f(x) = \sum_{n=0}^{N} c_n x |x|^{2n} + O(|x|^{2n+2}) \tag{1}$$

In some examples, the UE 115-a may estimate a polynomial including memory components such as $x[n]*|x[n-d]|^2$, $x[n]*x[n-d_1]*\text{conj}(x[n-d_2])$, or $x[n]*|x[n-d_3]|^2$. As described with reference to Equation 1 and the example memory components described herein, x may represent a signal (e.g., as a function of time) transmitted by the network entity 105-a, 2N may represent the order of the kernel (e.g., a higher power order of the polynomial-approximated expression), $c_n$ may represent coefficients (e.g., complex coefficients) of the PA model, O may represent an upper bound of a numeric error of the model, and d, $d_1$, $d_2$, and $d_3$ may represent delays associated with memory components of the PA.

The network entity 105-a may use a set of PAs and may transmit using a transmit power different from PAs and transmit powers used by other network entities 105. Thus, the PA models used in communications with the network entity 105-a may be different from PA models used in communication with the other network entities 105. That is, the UE 115-a may use different kernels for the DPoD procedure with each network entity 105, and thus the UE 115-a may determine a different DPoD kernel to use with each network entity 105.

A first kernel may include a relatively large quantity of terms or terms with a relatively high order than a second kernel, which may include relatively fewer terms or terms with a relatively smaller order. If the UE 115-a performs a DPoD procedure using the first kernel, the DPoD procedure may result in a larger EVM associated with the PA model and may thus result in a more accurate DPoD procedure. However, the DPoD procedure using the first kernel may additionally result in increased power consumption and latency at the UE 115-a. Some communications may be associated with a target EVM (e.g., a threshold EVM), and in some conditions (e.g., communications with a lower MCS index), the target EVM may be lower than in some other conditions. In some examples, the UE 115-a may apply the first kernel while engaging in a DPoD procedure, which may result in an EVM that is larger than the target EVM. Thus, the UE 115-a may degrade an efficiency of communications (e.g., due to increased power consumption and complexity) by applying the first kernel. Additionally, or alternatively, applying the first kernel may result in increased overfitting estimation error, which may result in a lower quality of communication at the UE 115-a.

Accordingly, techniques described herein may allow for an improved DPoD procedure and improved reporting of MCS index limitations for communications between the UE 115-a and the network entity 105-a. For example, the network entity 105-a may transmit, to the UE 115-a (e.g., and any other UEs 115 in the cell of the network entity 105-a), a downlink message including an indication 205 of multiple DPoD kernels for the UE 115-a to use in the DPoD procedure. In some examples, the network entity 105-a may transmit a table, via the indication 205, including multiple DPoD kernels and EVMs associated with each of the multiple DPoD kernels. The UE 115-a may select a DPoD kernel from the multiple DPoD kernels based on a target demodulation SNR (e.g., in decibels (dB)) and a power limitation (e.g., a battery level) of the UE 115-a. For example, in some modes of operation (e.g., in mission mode), the UE 115-a may determine a target EVM for communications with the network entity 105-a and may select the DPoD kernel which may achieve (e.g., but may not exceed) the target EVM from the multiple DPoD kernels.

In some aspects, the network entity 105-a may perform a calibration process (e.g., an offline factory calibration process prior to deployment) to calculate a set of DPoD kernels for each of multiple target EVMs. For example, the network entity 105-a may input a signal x(t) into each PA of the network entity 105-a (e.g., using a transmission power which may be the same as an intended operation power). The network entity 105-a may measure a output signal f(x(t)) of each of the PAs and select a kernel (e.g., a new candidate kernel) to examine. The network entity 105-a may build a least-square (LS) estimator to the kernel components coefficients $c_n$ using the input signal x(t), the output signal f(x(t)), and the candidate kernel.

As an illustrative example, to build the LS estimator, the network entity 105-a may select a candidate kernel described by $f(x) = c_0 x + c_1 x |x|^2 + c_2 x |x|^4$. The output signal f(x(t)) may thus be described as $f(x(t)) = c_0 x(t) + c_1 x(t)|x(t)|^2 + c_2 x(t)|x(t)|^4 + noise(t)$. Equation 2 may represent an LS estimator for a signal x(t) containing N samples, as:

$$\begin{bmatrix} f(x(0)) \\ f(x(1)) \\ \vdots \\ f(x(N-1)) \end{bmatrix} = \underbrace{\begin{bmatrix} x(0) & x(0)|x(0)|^2 & x(0)|x(0)|^4 \\ x(1) & x(1)|x(1)|^2 & x(1)|x(1)|^4 \\ \vdots & \vdots & \vdots \\ x(N-1) & x(N-1)|x(N-1)|^2 & x(N-1)|x(N-1)|^4 \end{bmatrix}}_{M} * \underbrace{\begin{bmatrix} c_0 \\ c_1 \\ c_2 \end{bmatrix}}_{\theta} + \begin{bmatrix} noise(0) \\ noise(1) \\ \vdots \\ noise(N-1) \end{bmatrix} \quad (2)$$

The LS estimator $\hat{\theta}$ may accordingly be defined as $\hat{\theta} = (M^H M)^{-1} M^H f(x(t))$, where $M^H$ may represent the Hamiltonian of the matrix M. The network entity 105-a may calculate a PA output $$\hat{f}(x) = \sum_{n=0}^{N} \hat{c}_n x |x|^{2n}$$

and measure the EVM associated with the candidate kernel (e.g., by calculating $\|\hat{f}(x(t)) - f(x(t))\|^2$). The network entity 105-a may select new candidate kernels and repeat the EVM calculation process as described herein for each candidate kernel.

The network entity 105-a may select a set of kernels from the candidate kernels, each associated with a similar EVM. For example, each kernel of the set of kernels may be associated with an EVM that may have a value within a threshold (e.g., 0.2 dB) of a target EVM. The network entity 105-a may select a kernel of the set of kernels with the smallest size or order and may repeat the kernel selection process for each target EVM of a set of target EVMs. The network entity 105-a may accordingly generate the table including the smallest kernels associated with each target EVM and the target EVMs (e.g., and a kernel index associated with each of the kernels). As an illustrative example, the network entity 105-a may generate a table such as Table 1 below, including N kernels with different degrees (e.g., orders) and different quantities of memory terms.

TABLE 1

| Kernel | Kernel index | EVM [dB] |
|---|---|---|
| $c_0 x_n$ | 0 | −27 |
| $c_0 x_n + c_1 x_n |x_{n-d_1}|^2$ | 1 | −28 |
| $c_0 x_n + c_1 x_n |x_{n-d_2}|^2$ | 2 | −29 |
| ... | ... | ... |
| $c_0 x_n + c_1 x_n x_{n-d_2} x_{n-d_3}{}^* + c_2 x_n |x_{n-d_4}|^4$ | N − 2 | −49 |
| $c_0 x_n + c_1 x_n |x_{n-d_2}|^2 + c_2 x_n |x_{n-d_4}|^4 + c_3 x_n |x_{n-d_5}|^4 x_{n-d_6} x_{n-d_7}^*$ | N − 1 | −50 |

The network entity 105-a may transmit the table in the indication 205 to the UE 115-a (e.g., via a medium access control-control element (MAC-CE) or a radio resource control (RRC) message). In some examples, after establishing a connection with the network entity 105-*a*, the UE 115-*a* may transmit a capability report to the network entity 105-*a* indicating a capability of the UE 115-*a* to perform adaptive DPoD kernel selection, and the network entity 105-*a* may transmit the table in accordance with the capability of the UE 115-*a*. The UE 115-*a* may determine which of the N kernels to apply (e.g., in each slot) to demodulate a signal with reduced (e.g., minimal) power consumption according to a target EVM. That is, the UE 115-*a* may determine a tradeoff between a kernel with a higher kernel index (e.g., associated with a larger EVM and a higher estimation accuracy) and a kernel with a lower kernel index (e.g., with a lower power consumption and latency associated with the DPoD algorithm).

In some aspects, the UE 115-*a* may determine the target EVM for communication with the network entity 105-*a* based on a modulation order (e.g., MCS order) associated with the communications. For example, each modulation order may be associated with a different target EVM, and the UE 115-*a* may be configured (e.g., preconfigured) with a second table of EVM values which may be sufficient for a given modulation order. The UE 115-*a* may determine a target EVM by determining an EVM from the table (e.g., Table 1) which is greater (e.g., better) than the EVM associated with the modulation order by a threshold (e.g., 6 dB). In the example of Table 1, for a modulation order of 6 bits (e.g., 64 quadrature amplitude modulation (QAM) operable at 22 dB of added white Gaussian noise (AWGN)), the UE 115-*a* may determine to use the kernel associated with kernel index 1, as kernel index 1 is associated with an EVM which is the threshold (e.g., 6 dB) larger than 22 dB. For a modulation order of 13 bits (e.g., 8192 QAM operable at 43 dB AWGN), the UE 115-*a* may determine to use the kernel associated with kernel index N−2, as kernel index N−2 is associated with an EVM which is the threshold larger than 43 dB.

In some examples, the UE 115-*a* may determine a limitation for an MCS index (e.g., a setting or parameter) and transmit an MCS recommendation report 210 to the network entity 105-*a*. For example, the UE 115-*a* may determine the limitation for the MCS index based on DPoD complexity (e.g., size and order of the kernel) and a power limitation (e.g., a battery level) of the UE 115-*a*, as described in further detail with reference to FIG. 3. The UE 115-*a* may transmit the recommendation report including the requested MCS index via a physical uplink shared channel (PUSCH).

Accordingly, the UE 115-*a* may communicate with the network entity 105-*a* using the MCS and DPoD kernel associated with the target EVM. That is, the UE 115-*a* may apply the selected DPoD kernel in the DPoD procedure according to the table in the indication 205, and thus may reduce power consumption and latency associated with performing a DPoD procedure.

Figure 3:
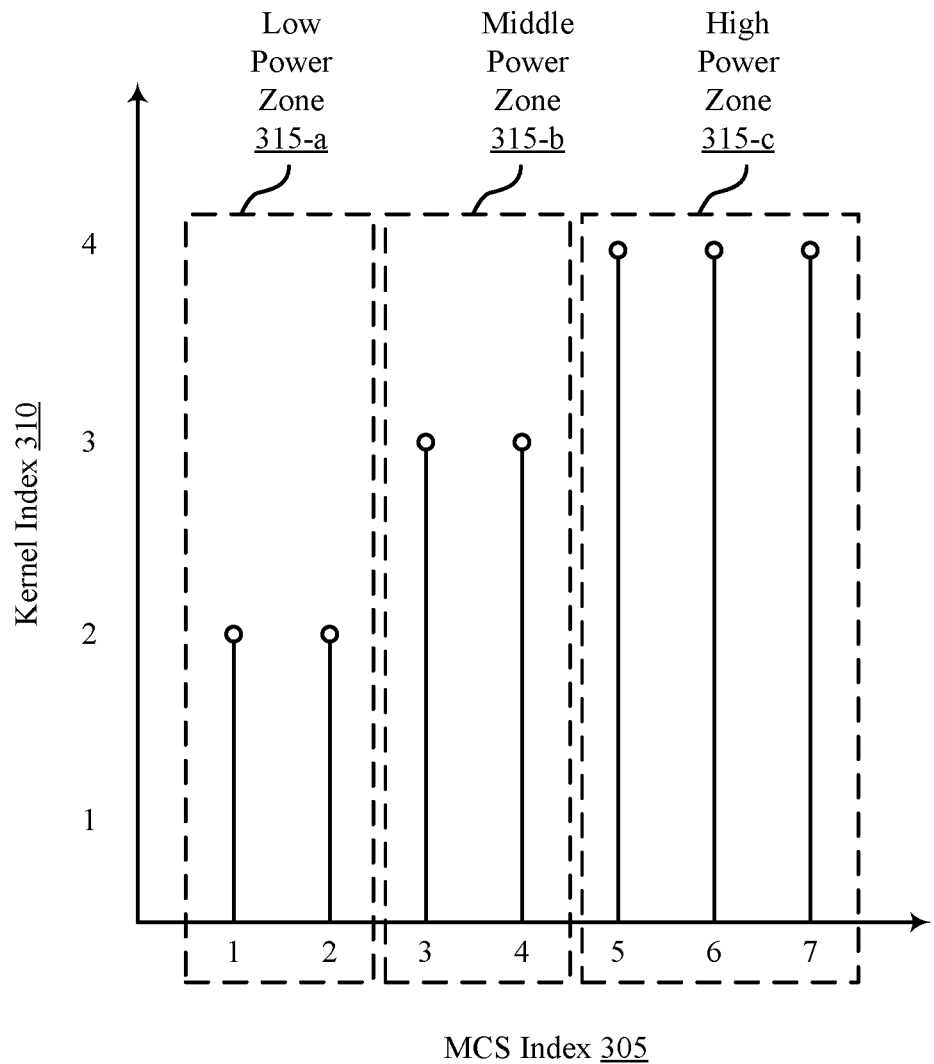
FIG. 3 shows an example of a power usage diagram that supports adaptive DpoD and MCS index reporting in accordance with one or more aspects of the present disclosure.

FIG. 3 shows an example of a power usage diagram 300 that supports adaptive DPoD and MCS index reporting in accordance with one or more aspects of the present disclosure. In some cases, the power usage diagram may implement or be implemented by aspects of the wireless communications system 100 and the wireless communications system 200. For example, the power usage diagram 300 may be associated with a UE 115 and a network entity 105, which may be examples of the corresponding devices as described with reference to FIG. 1.

In some examples, a UE 115 may determine an MCS index 305 and transmit an MCS recommendation report in an uplink message to a network entity 105. For example, if the UE 115 determines that channel conditions are above (e.g., satisfy) a threshold (e.g., by measuring a link SNR), the UE 115 may recommend using an MCS associated with a higher MCS index 305 (e.g., 1024 QAM). Communications using the MCS associated with the higher MCS index 305 may result in benefits such as a shorter transmission duration for a given data packet or quantity of bits. That is, using the MCS associated with the higher MCS index 305 may result in shorter slots and an earlier RF shutdown as compared to an MCS with a lower MCS index 305, which may result in the UE 115 using battery power for less time.

However, if the UE 115 has a lower battery level, the UE 115 may determine that using an MCS with a lower MCS index 305 may save more power (e.g., even if channel conditions are above the threshold). For example, to demodulate an MCS associated with a higher MCS index 305, the UE 115 may determine that a target EVM associated with the higher MCS index 305 corresponds to a DPoD kernel with a higher kernel index 310 (e.g., a longer or higher order DPoD kernel). However, demodulating a signal using a DPoD kernel with a higher kernel index 310 may incur more power consumption at the UE 115. Therefore, the UE 115 may instead request to use an MCS associated with a lower MCS index 305, and thus a DPoD kernel with a smaller kernel index 310. Thus, the UE 115-*a* may determine a limitation for an MCS index 305 based on the channel conditions (e.g., the link SNR), a battery level of the UE, and a complexity (e.g., length or order) of DPoD kernels transmitted by the network entity 105.

As an illustrative example, the UE 115 may determine that channel conditions are above a threshold associated with using an MCS with MCS index 5. However, the MCS associated with MCS index 5 may be demodulated with a longer or higher order kernel associated with a higher kernel index 310 (e.g., kernel index 4). The UE 115 may determine that demodulating a signal with the kernel associated with kernel index 4 will result in power usage which falls within a high power zone 315-*c*. If the UE 115 determines that it has a power limitation (e.g., a battery level below a threshold), the UE 115 may select an MCS which will result in relatively less power usage than the MCS index 5 (e.g., with power usage which falls within a middle power zone 315-*b*), such an MCS associated with MCS index 4 and kernel index 3. If the UE 115 determines that it has an additional power limitation (e.g., a battery level below a second threshold), the UE 115 may select an MCS which will result in less power usage (e.g., with power usage which falls within a low power zone 315-*a*), such an MCS associated with MCS index 2 and kernel index 2.

The UE 115 may accordingly transmit a recommendation report indicating the selected MCS to the network entity 105 (e.g., via PUSCH). In such cases, the UE 115 may demodulate a signal with a lower MCS (e.g., and a lower throughput). The UE 115 may therefore use a less complex (e.g., smaller or lower order) DPoD kernel to demodulate the signal, resulting in reduced power consumption at the UE 115.

In some examples, the network entity 105 may determine to use an MCS associated with an MCS index 305 different from the MCS index 305 indicated in the MCS recommendation report from the UE 115. For example, the message may include data associated with a higher priority (e.g., or may be a critical message). The network entity 105 may accordingly determine to use an MCS associated with a higher MCS index 305 than the MCS indicted by the MCS recommendation report from the UE 115, which may result in higher throughput and transmission speeds.

The multiple possible DPoD kernels and associated EVMs may be different for each network entity 105 (e.g., depending on the PAs of the network entities 105). The limitation for the MCS index 305 and MCS recommendation report may be different for each UE 115 (e.g., depending on battery level, channel conditions, and power consumption associated with DpoD for each UE 115). Thus, the DpoD kernel indication and MCS recommendation report may be exchanged between each network entity 105 and each UE 115 (e.g., when each respective UE 115 may establish a connection with each respective network entity 105).

Figure 4:
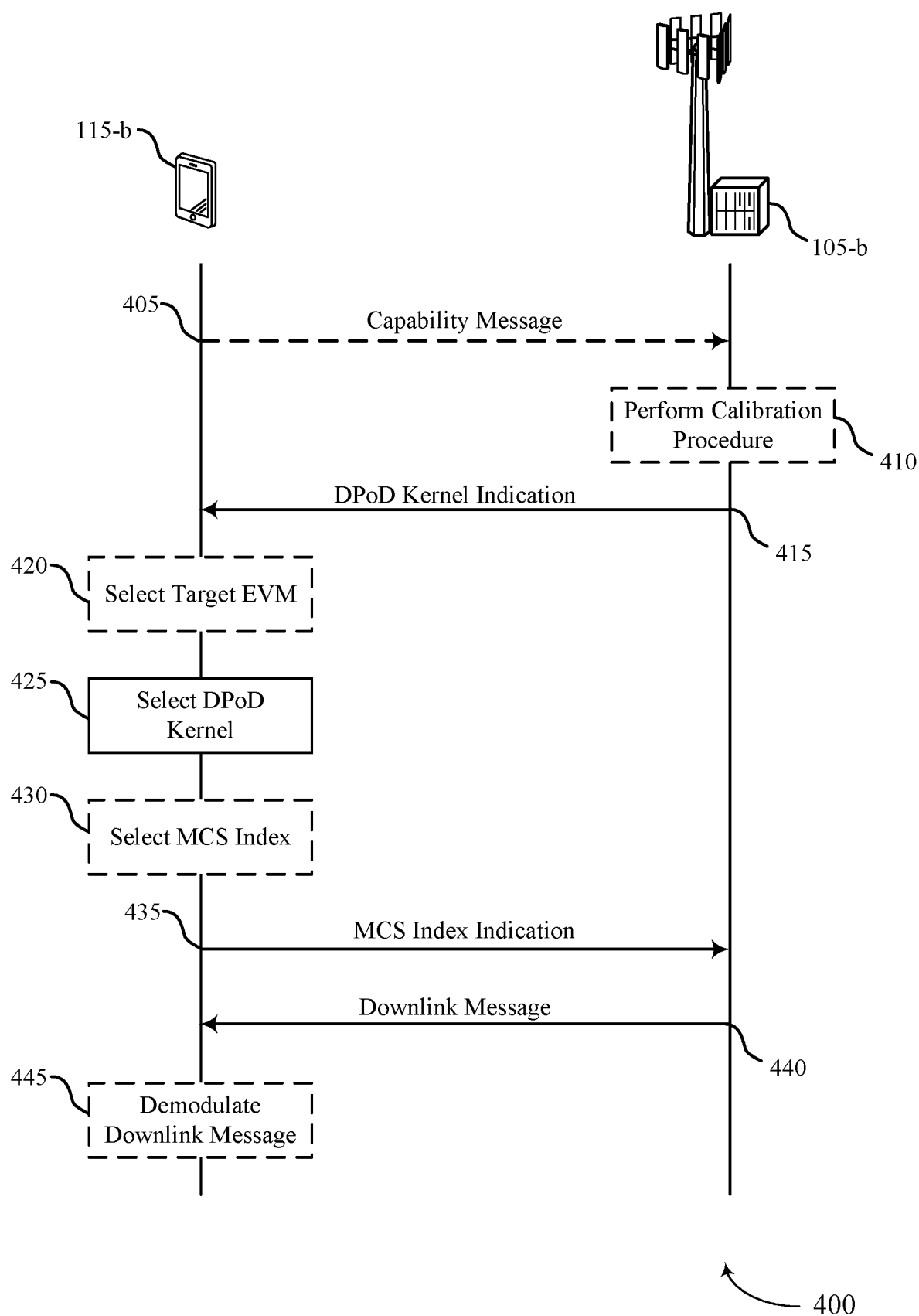
FIG. 4 shows an example of a process flow that supports adaptive DpoD and MCS index reporting in accordance with one or more aspects of the present disclosure.

FIG. 4 shows an example of a process flow 400 that supports adaptive DpoD and MCS index reporting in accordance with one or more aspects of the present disclosure. In some cases, the process flow 400 may implement or be implemented by aspects of the wireless communications system 100, the wireless communications system 200, and the power usage diagram 300. For example, the process flow 400 may include a UE 115 (e.g., a UE 115-b) and a network entity 105 (e.g., a network entity 105-b), which may be examples of the corresponding devices as described with reference to FIG. 1. In the following description of the process flow 400, the operations between the network entity 105-b and the UE 115-b may be transmitted in a different order than the example order shown. Some operations may also be omitted from the process flow 400, and other operations may be added to the process flow 400. Further, although some operations or signaling may be shown to occur at different times for discussion purposes, these operations may actually occur at the same time.

In some examples, at 405, the UE 115-b may transmit a capability message to the network entity 105-b. The capability message may include a capability of the UE 115-b to perform adaptive DpoD.

At 410, the network entity 105-b may perform a calibration procedure to obtain the multiple DpoD kernels and the one or more EVMs associated with each of the multiple DpoD kernels. To perform the calibration procedure, the network entity 105-b may input an input signal into one or more PAs of the network entity 105-b using a transmission power at which the network entity 105-b operates. The network entity 105-b may generate an LS estimator based on the input signal, an output signal, and one or more candidate DpoD kernels. The network entity 105-b may calculate an output of the one or more PAs in accordance with the LS estimator and measure an EVM using the output signal and the output of the one or more PAs.

In some examples, the calibration procedure may occur prior to the network entity 105-b being deployed in a wireless communications system. For example, the non-linearities of the one or more PAs of the network entity 105-b may be determined and stored by the network entity 105-b, the non-linearities based on measurements (e.g., calibrations) obtained from testing of the network entity 105-b as part of the design and manufacturing process.

At 415, the network entity 105-b may transmit, to the UE 115-b, an indication of multiple DPoD kernels each associated with one or more EVMs. In some cases, based on the calibration procedure, the network entity 105-b may select a DPoD kernel of the one or more DPoD kernels which corresponds to a first EVM. The network entity 105-b may select the DPoD kernel of the one or more DPoD kernels based on the DPoD kernel being less complex (e.g., shorter or lower order) than another DPoD kernel associated with the first EVM. The network entity 105-b may additionally select DPoD kernels of the one or more DPoD kernels associated with each EVM of a set of EVMs (e.g., including the first EVM). In some examples, at 420, the UE 115-b may select a target EVM from the set of EVMs. For example, the UE 115-b may select a target EVM based on the target EVM satisfying an EVM threshold. The UE 115-b may determine the EVM threshold based on one or more of a modulation order, an MCS, and a battery level of the UE.

At 425, the UE 115-b may select a DPoD kernel from the multiple DPoD kernels. For example, the UE 115-b may select a DPoD kernel based on the DPoD kernel corresponding to the target EVM.

In some examples, at 430, the UE 115-b may select a first MCS index to use in communication with the network entity 105-b. For example, the UE 115-b may select the first MCS index based on one or more of an SNR of a channel used for communication with the network entity 105-b, the indication of the multiple DPoD kernels, and a battery level of the UE 115-b.

At 435, the UE 115-b may transmit, to the network entity 105-b, an indication of the first MCS index. For example, the UE 115-b may transmit a recommendation report to the network entity 105-b including a requested MCS index (e.g., a limitation for the MCS index) based on the SNR of the channel used for communication with the network entity 105-b, the indication of the multiple DPoD kernels, and the battery level of the UE 115-b.

At 440, the network entity 105-b may transmit a downlink message to the UE 115-b. For example, the network entity 105-b may transmit the downlink message using an MCS associated with the first MCS index. In some examples, the network entity 105-b may transmit the downlink message using an MCS different from the MCS associated with the first MCS index. For example, the network entity 105-b may transmit the downlink message using an MCS associated with a second MCS index higher than the first MCS index based on a priority of the downlink message.

In some examples, at 445, the UE 115-b may demodulate the downlink message. For example, the UE 115-b may receive the downlink message using the first MCS index or the second MCS index and may demodulate the downlink message using the selected DPoD kernel.

Figure 5:
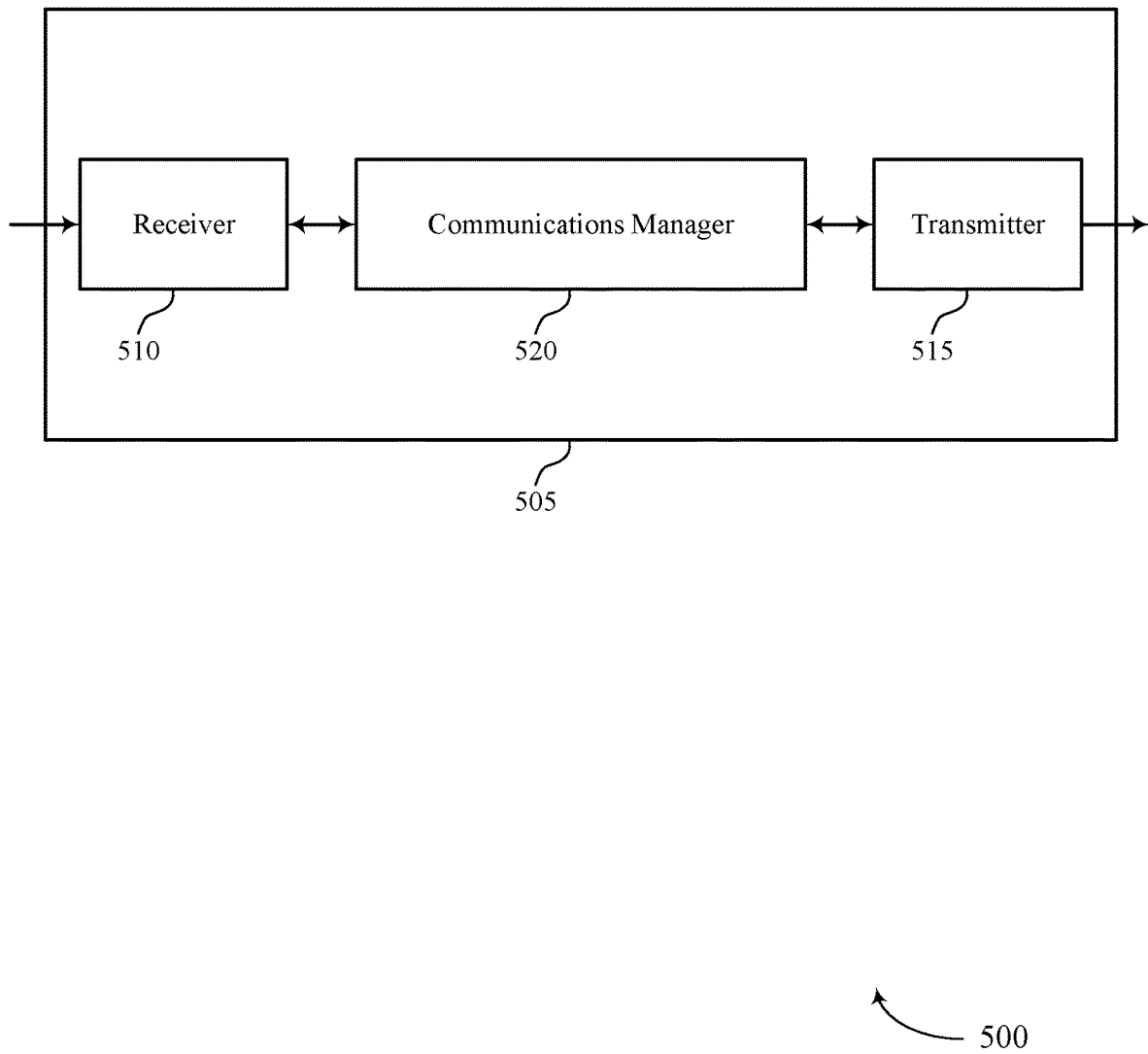
FIGS. 5 and 6 show block diagrams of devices that support adaptive DpoD and MCS index reporting in accordance with one or more aspects of the present disclosure.

FIG. 5 shows a block diagram 500 of a device 505 that supports adaptive DPoD and MCS index reporting in accordance with one or more aspects of the present disclosure. The device 505 may be an example of aspects of a UE 115 as described herein. The device 505 may include a receiver 510, a transmitter 515, and a communications manager 520. The device 505 may also include a processor. Each of these components may be in communication with one another (e.g., via one or more buses).

The receiver 510 may provide a means for receiving information such as packets, user data, control information, or any combination thereof associated with various information channels (e.g., control channels, data channels, information channels related to adaptive DPoD and MCS index reporting). Information may be passed on to other components of the device 505. The receiver 510 may utilize a single antenna or a set of multiple antennas.

The transmitter 515 may provide a means for transmitting signals generated by other components of the device 505. For example, the transmitter 515 may transmit information such as packets, user data, control information, or any combination thereof associated with various information channels (e.g., control channels, data channels, information channels related to adaptive DPoD and MCS index reporting). In some examples, the transmitter 515 may be co-located with a receiver 510 in a transceiver module. The transmitter 515 may utilize a single antenna or a set of multiple antennas.

The communications manager 520, the receiver 510, the transmitter 515, or various combinations thereof or various components thereof may be examples of means for performing various aspects of adaptive DPoD and MCS index reporting as described herein. For example, the communications manager 520, the receiver 510, the transmitter 515, or various combinations or components thereof may support a method for performing one or more of the functions described herein.

In some examples, the communications manager 520, the receiver 510, the transmitter 515, or various combinations or components thereof may be implemented in hardware (e.g., in communications management circuitry). The hardware may include a processor, a digital signal processor (DSP), a central processing unit (CPU), an application-specific integrated circuit (ASIC), a field-programmable gate array (FPGA) or other programmable logic device, a microcontroller, discrete gate or transistor logic, discrete hardware components, or any combination thereof configured as or otherwise supporting a means for performing the functions described in the present disclosure. In some examples, a processor and memory coupled with the processor may be configured to perform one or more of the functions described herein (e.g., by executing, by the processor, instructions stored in the memory).

Additionally, or alternatively, in some examples, the communications manager 520, the receiver 510, the transmitter 515, or various combinations or components thereof may be implemented in code (e.g., as communications management software or firmware) executed by a processor. If implemented in code executed by a processor, the functions of the communications manager 520, the receiver 510, the transmitter 515, or various combinations or components thereof may be performed by a general-purpose processor, a DSP, a CPU, an ASIC, an FPGA, a microcontroller, or any combination of these or other programmable logic devices (e.g., configured as or otherwise supporting a means for performing the functions described in the present disclosure).

In some examples, the communications manager 520 may be configured to perform various operations (e.g., receiving, obtaining, monitoring, outputting, transmitting) using or otherwise in cooperation with the receiver 510, the transmitter 515, or both. For example, the communications manager 520 may receive information from the receiver 510, send information to the transmitter 515, or be integrated in combination with the receiver 510, the transmitter 515, or both to obtain information, output information, or perform various other operations as described herein.

The communications manager 520 may support wireless communications at a UE in accordance with examples as disclosed herein. For example, the communications manager 520 is capable of, configured to, or operable to support a means for receiving an indication of a set of multiple DPoD kernels associated with a network entity, each DPoD kernel associated with one or more error vector magnitudes. The communications manager 520 is capable of, configured to, or operable to support a means for selecting a DPoD kernel of the set of multiple DPoD kernels associated with the network entity based on a target error vector magnitude at the UE. The communications manager 520 is capable of, configured to, or operable to support a means for transmitting an indication of an MCS index in accordance with the selected DPoD kernel and the target error vector magnitude. The communications manager 520 is capable of, configured to, or operable to support a means for receiving a downlink message based on the selected DPoD kernel and the indicated MCS index.

By including or configuring the communications manager 520 in accordance with examples as described herein, the device 505 (e.g., a processor controlling or otherwise coupled with the receiver 510, the transmitter 515, the communications manager 520, or a combination thereof) may support techniques for adaptive DPoD and MCS index reporting which may result in reduced processing and reduced power consumption.

Figure 6:
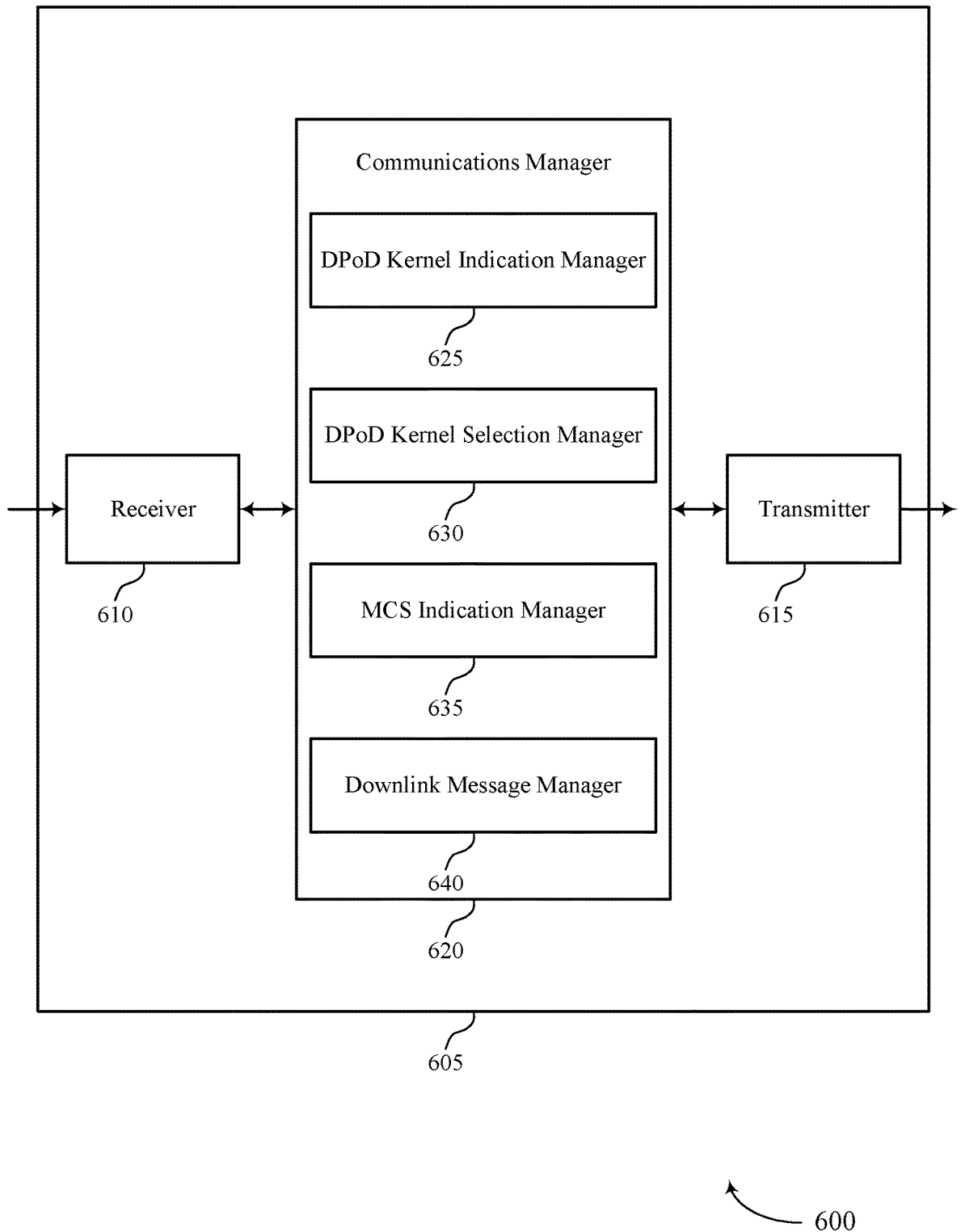

FIG. 6 shows a block diagram 600 of a device 605 that supports adaptive DPoD and MCS index reporting in accordance with one or more aspects of the present disclosure. The device 605 may be an example of aspects of a device 505 or a UE 115 as described herein. The device 605 may include a receiver 610, a transmitter 615, and a communications manager 620. The device 605 may also include a processor. Each of these components may be in communication with one another (e.g., via one or more buses).

The receiver 610 may provide a means for receiving information such as packets, user data, control information, or any combination thereof associated with various information channels (e.g., control channels, data channels, information channels related to adaptive DPoD and MCS index reporting). Information may be passed on to other components of the device 605. The receiver 610 may utilize a single antenna or a set of multiple antennas.

The transmitter 615 may provide a means for transmitting signals generated by other components of the device 605. For example, the transmitter 615 may transmit information such as packets, user data, control information, or any combination thereof associated with various information channels (e.g., control channels, data channels, information channels related to adaptive DPoD and MCS index reporting). In some examples, the transmitter 615 may be co-located with a receiver 610 in a transceiver module. The transmitter 615 may utilize a single antenna or a set of multiple antennas.

The device 605, or various components thereof, may be an example of means for performing various aspects of adaptive DPoD and MCS index reporting as described herein. For example, the communications manager 620 may include a DPoD kernel indication manager 625, a DPoD kernel selection manager 630, an MCS indication manager 635, a downlink message manager 640, or any combination thereof. The communications manager 620 may be an example of aspects of a communications manager 520 as described herein. In some examples, the communications manager 620, or various components thereof, may be configured to perform various operations (e.g., receiving, obtaining, monitoring, outputting, transmitting) using or otherwise in cooperation with the receiver 610, the transmitter 615, or both. For example, the communications manager 620 may receive information from the receiver 610, send information to the transmitter 615, or be integrated in combination with the receiver 610, the transmitter 615, or both to obtain information, output information, or perform various other operations as described herein.

The communications manager 620 may support wireless communications at a UE in accordance with examples as disclosed herein. The DPoD kernel indication manager 625 is capable of, configured to, or operable to support a means for receiving an indication of a set of multiple DPoD kernels associated with a network entity, each DPoD kernel associated with one or more error vector magnitudes. The DPoD kernel selection manager 630 is capable of, configured to, or operable to support a means for selecting a DPoD kernel of the set of multiple DPoD kernels associated with the network entity based on a target error vector magnitude at the UE. The MCS indication manager 635 is capable of, configured to, or operable to support a means for transmitting an indication of an MCS index in accordance with the selected DPoD kernel and the target error vector magnitude. The downlink message manager 640 is capable of, configured to, or operable to support a means for receiving a downlink message based on the selected DPoD kernel and the indicated MCS index.

Figure 7:
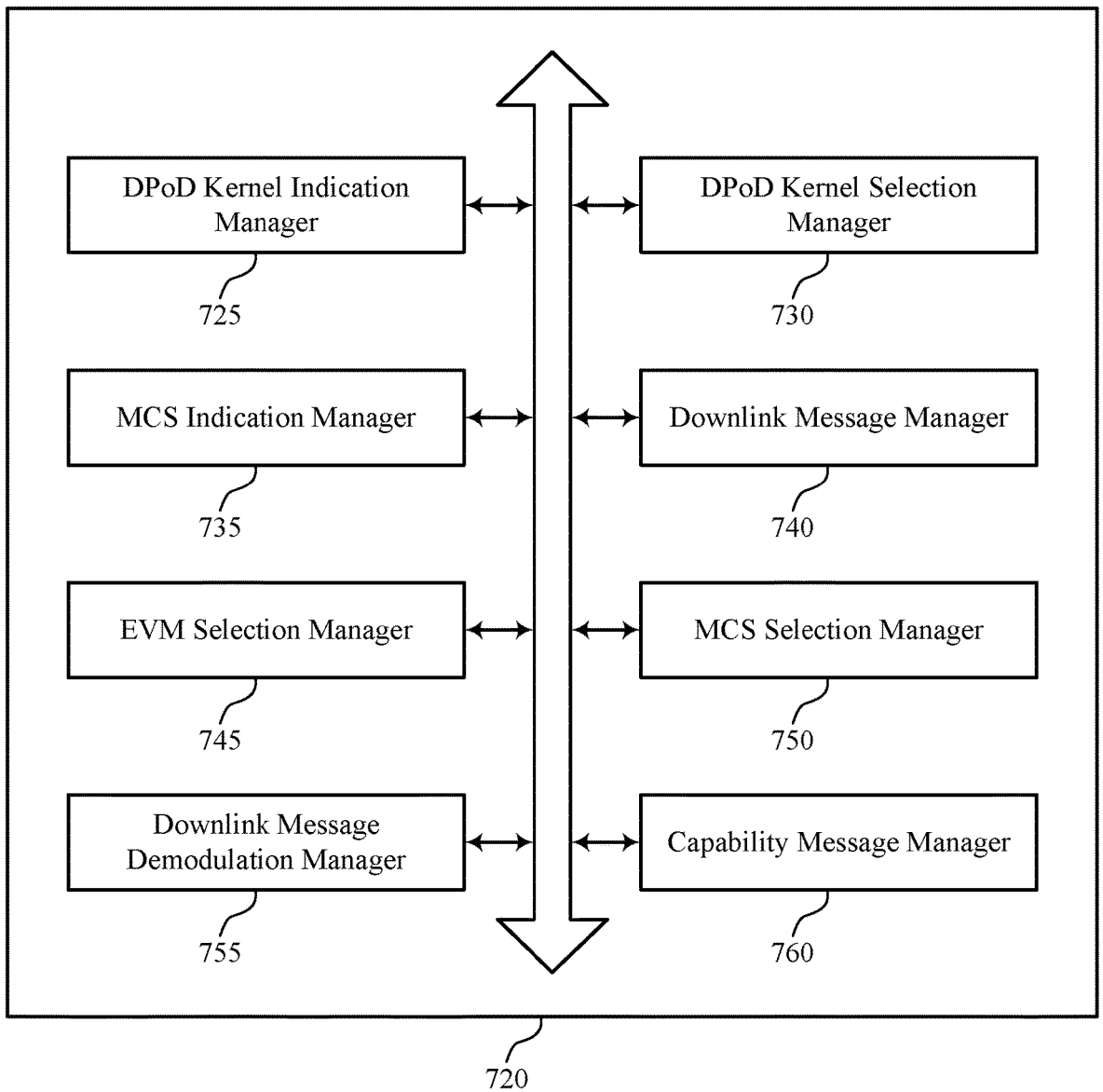
FIG. 7 shows a block diagram of a communications manager that supports adaptive DpoD and MCS index reporting in accordance with one or more aspects of the present disclosure.

FIG. 7 shows a block diagram 700 of a communications manager 720 that supports adaptive DPoD and MCS index reporting in accordance with one or more aspects of the present disclosure. The communications manager 720 may be an example of aspects of a communications manager 520, a communications manager 620, or both, as described herein. The communications manager 720, or various components thereof, may be an example of means for performing various aspects of adaptive DPoD and MCS index reporting as described herein. For example, the communications manager 720 may include a DPoD kernel indication manager 725, a DPoD kernel selection manager 730, an MCS indication manager 735, a downlink message manager 740, a EVM selection manager 745, an MCS selection manager 750, a downlink message demodulation manager 755, a capability message manager 760, or any combination thereof. Each of these components may communicate, directly or indirectly, with one another (e.g., via one or more buses).

The communications manager 720 may support wireless communications at a UE in accordance with examples as disclosed herein. The DPoD kernel indication manager 725 is capable of, configured to, or operable to support a means for receiving an indication of a set of multiple DPoD kernels associated with a network entity, each DPoD kernel associated with one or more error vector magnitudes. The DPoD kernel selection manager 730 is capable of, configured to, or operable to support a means for selecting a DPoD kernel of the set of multiple DPoD kernels associated with the network entity based on a target error vector magnitude at the UE. The MCS indication manager 735 is capable of, configured to, or operable to support a means for transmitting an indication of an MCS index in accordance with the selected DPoD kernel and the target error vector magnitude. The downlink message manager 740 is capable of, configured to, or operable to support a means for receiving a downlink message based on the selected DPoD kernel and the indicated MCS index.

In some examples, to support selecting the DPoD kernel, the EVM selection manager 745 is capable of, configured to, or operable to support a means for selecting the target error vector magnitude from the one or more error vector magnitudes based on an error vector magnitude threshold.

In some examples, the error vector magnitude threshold is based on one or more of a modulation order, a MCS, a battery level of the UE, or any combination thereof.

In some examples, the MCS selection manager 750 is capable of, configured to, or operable to support a means for selecting the MCS index based on a signal-to-noise ratio associated with communications between the UE and a network entity, the indication of the set of multiple DPoD kernels, and a battery level the UE.

In some examples, the indication of the set of multiple DPoD kernels includes, for each DPoD kernel of the set of multiple DPoD kernels, an indication one or more corresponding error vector magnitudes.

In some examples, to support receiving the downlink message, the downlink message manager 740 is capable of, configured to, or operable to support a means for receiving the downlink message in accordance with a second MCS index that is different from the indicated MCS index based on a priority of the downlink message.

In some examples, the downlink message demodulation manager 755 is capable of, configured to, or operable to support a means for demodulating the downlink message based on the selected DPoD kernel and the indicated MCS index.

In some examples, the capability message manager 760 is capable of, configured to, or operable to support a means for transmitting a capability message indicating a capability of the UE to perform adaptive DPoD.

In some examples, to support receiving the indication of the set of multiple DPoD kernels, the DPoD kernel indication manager 725 is capable of, configured to, or operable to support a means for receiving a medium access control-control element or a radio resource control message indicating the set of multiple DPoD kernels.

Figure 8:
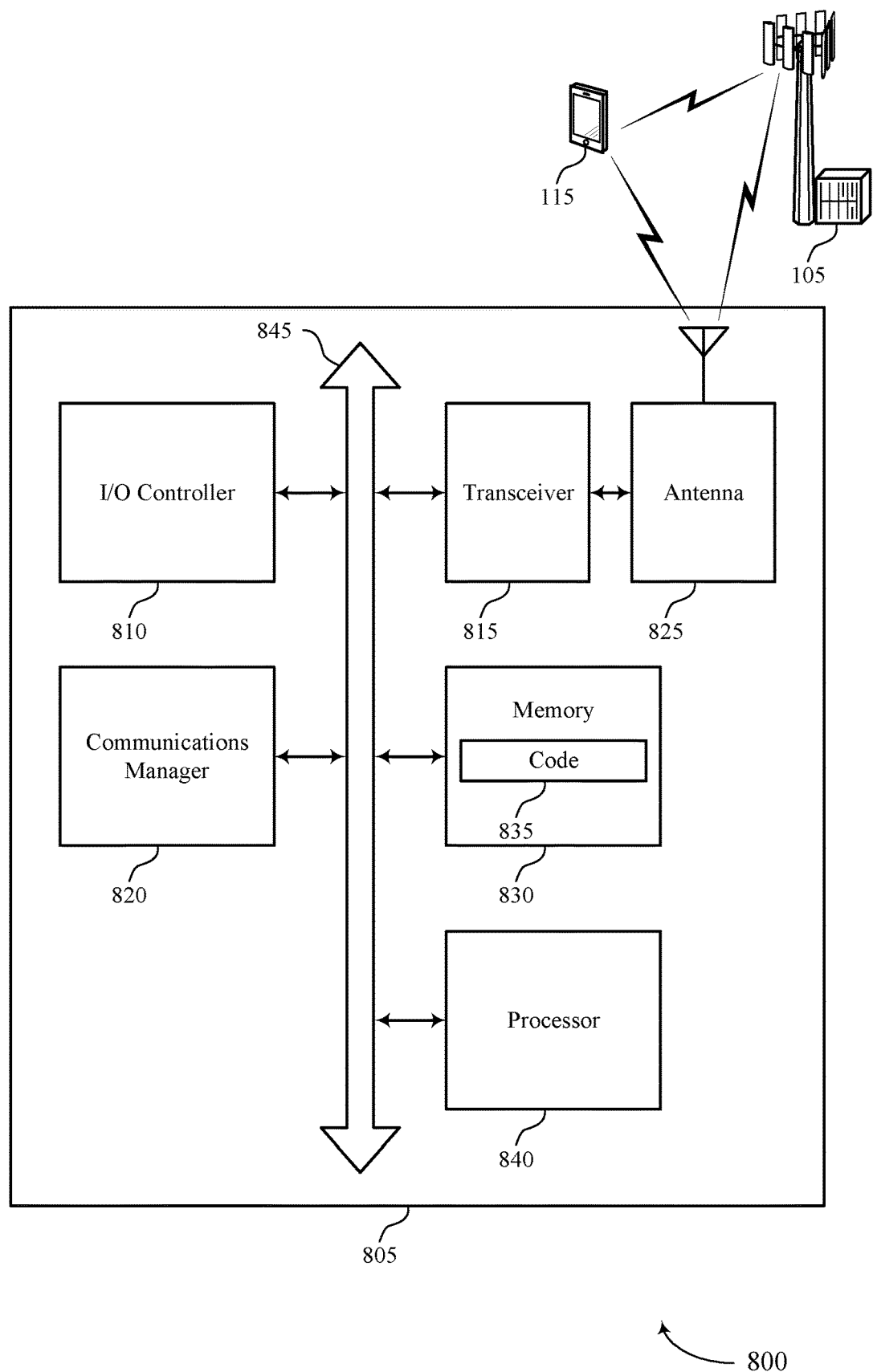
FIG. 8 shows a diagram of a system including a device that supports adaptive DpoD and MCS index reporting in accordance with one or more aspects of the present disclosure.

FIG. 8 shows a diagram of a system 800 including a device 805 that supports adaptive DPoD and MCS index reporting in accordance with one or more aspects of the present disclosure. The device 805 may be an example of or include the components of a device 505, a device 605, or a UE 115 as described herein. The device 805 may communicate (e.g., wirelessly) with one or more network entities 105, one or more UEs 115, or any combination thereof. The device 805 may include components for bi-directional voice and data communications including components for transmitting and receiving communications, such as a communications manager 820, an input/output (I/O) controller 810, a transceiver 815, an antenna 825, a memory 830, code 835, and a processor 840. These components may be in electronic communication or otherwise coupled (e.g., operatively, communicatively, functionally, electronically, electrically) via one or more buses (e.g., a bus 845).

The I/O controller 810 may manage input and output signals for the device 805. The I/O controller 810 may also manage peripherals not integrated into the device 805. In some cases, the I/O controller 810 may represent a physical connection or port to an external peripheral. In some cases, the I/O controller 810 may utilize an operating system such as iOS®, ANDROID®, MS-DOS®, MS-WINDOWS®, OS/2®, UNIX®, LINUX®, or another known operating system. Additionally, or alternatively, the I/O controller 810 may represent or interact with a modem, a keyboard, a mouse, a touchscreen, or a similar device. In some cases, the I/O controller 810 may be implemented as part of a processor, such as the processor 840. In some cases, a user may interact with the device 805 via the I/O controller 810 or via hardware components controlled by the I/O controller 810.

In some cases, the device 805 may include a single antenna 825. However, in some other cases, the device 805 may have more than one antenna 825, which may be capable of concurrently transmitting or receiving multiple wireless transmissions. The transceiver 815 may communicate bi-directionally, via the one or more antennas 825, wired, or wireless links as described herein. For example, the transceiver 815 may represent a wireless transceiver and may communicate bi-directionally with another wireless transceiver. The transceiver 815 may also include a modem to modulate the packets, to provide the modulated packets to one or more antennas 825 for transmission, and to demodulate packets received from the one or more antennas 825. The transceiver 815, or the transceiver 815 and one or more antennas 825, may be an example of a transmitter 515, a transmitter 615, a receiver 510, a receiver 610, or any combination thereof or component thereof, as described herein.

The memory 830 may include random access memory (RAM) and read-only memory (ROM). The memory 830 may store computer-readable, computer-executable code 835 including instructions that, when executed by the processor 840, cause the device 805 to perform various functions described herein. The code 835 may be stored in a non-transitory computer-readable medium such as system memory or another type of memory. In some cases, the code 835 may not be directly executable by the processor 840 but may cause a computer (e.g., when compiled and executed) to perform functions described herein. In some cases, the memory 830 may contain, among other things, a basic I/O system (BIOS) which may control basic hardware or software operation such as the interaction with peripheral components or devices.

The processor 840 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 840 may be configured to operate a memory array using a memory controller. In some other cases, a memory controller may be integrated into the processor 840. The processor 840 may be configured to execute computer-readable instructions stored in a memory (e.g., the memory 830) to cause the device 805 to perform various functions (e.g., functions or tasks supporting adaptive DPoD and MCS index reporting). For example, the device 805 or a component of the device 805 may include a processor 840 and memory 830 coupled with or to the processor 840, the processor 840 and memory 830 configured to perform various functions described herein.

The communications manager 820 may support wireless communications at a UE in accordance with examples as disclosed herein. For example, the communications manager 820 is capable of, configured to, or operable to support a means for receiving an indication of a set of multiple DPoD kernels associated with a network entity, each DPoD kernel associated with one or more error vector magnitudes. The communications manager 820 is capable of, configured to, or operable to support a means for selecting a DPoD kernel of the set of multiple DPoD kernels associated with the network entity based on a target error vector magnitude at the UE. The communications manager 820 is capable of, configured to, or operable to support a means for transmitting an indication of an MCS index in accordance with the selected DPoD kernel and the target error vector magnitude. The communications manager 820 is capable of, configured to, or operable to support a means for receiving a downlink message based on the selected DPoD kernel and the indicated MCS index.

By including or configuring the communications manager 820 in accordance with examples as described herein, the device 805 may support techniques for adaptive DPoD and MCS index reporting which may result in reduced latency, improved user experience related to reduced processing, reduced power consumption, longer battery life, and improved utilization of processing capability.

In some examples, the communications manager 820 may be configured to perform various operations (e.g., receiving, monitoring, transmitting) using or otherwise in cooperation with the transceiver 815, the one or more antennas 825, or any combination thereof. Although the communications manager 820 is illustrated as a separate component, in some examples, one or more functions described with reference to the communications manager 820 may be supported by or performed by the processor 840, the memory 830, the code 835, or any combination thereof. For example, the code 835 may include instructions executable by the processor 840 to cause the device 805 to perform various aspects of adaptive DPoD and MCS index reporting as described herein, or the processor 840 and the memory 830 may be otherwise configured to perform or support such operations.

Figure 9:
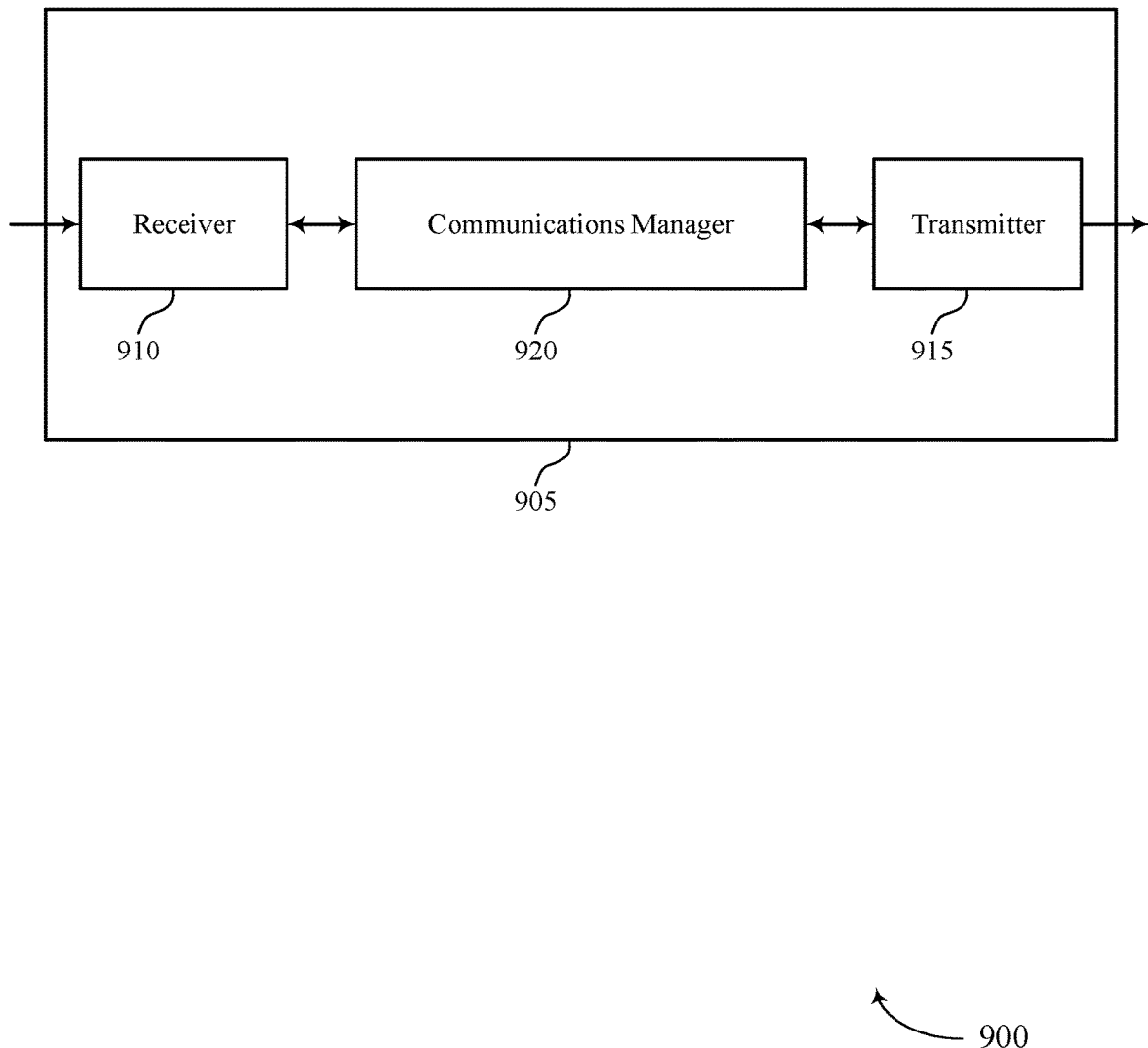
FIGS. 9 and 10 show block diagrams of devices that support adaptive DpoD and MCS index reporting in accordance with one or more aspects of the present disclosure.

FIG. 9 shows a block diagram 900 of a device 905 that supports adaptive DPoD and MCS index reporting in accordance with one or more aspects of the present disclosure. The device 905 may be an example of aspects of a network entity 105 as described herein. The device 905 may include a receiver 910, a transmitter 915, and a communications component 920. The device 905 may also include a processor. Each of these components may be in communication with one another (e.g., via one or more buses).

The receiver 910 may provide a means for obtaining (e.g., receiving, determining, identifying) information such as user data, control information, or any combination thereof (e.g., I/Q samples, symbols, packets, protocol data units, service data units) associated with various channels (e.g., control channels, data channels, information channels, channels associated with a protocol stack). Information may be passed on to other components of the device 905. In some examples, the receiver 910 may support obtaining information by receiving signals via one or more antennas. Additionally, or alternatively, the receiver 910 may support obtaining information by receiving signals via one or more wired (e.g., electrical, fiber optic) interfaces, wireless interfaces, or any combination thereof.

The transmitter 915 may provide a means for outputting (e.g., transmitting, providing, conveying, sending) information generated by other components of the device 905. For example, the transmitter 915 may output information such as user data, control information, or any combination thereof (e.g., I/Q samples, symbols, packets, protocol data units, service data units) associated with various channels (e.g., control channels, data channels, information channels, channels associated with a protocol stack). In some examples, the transmitter 915 may support outputting information by transmitting signals via one or more antennas. Additionally, or alternatively, the transmitter 915 may support outputting information by transmitting signals via one or more wired (e.g., electrical, fiber optic) interfaces, wireless interfaces, or any combination thereof. In some examples, the transmitter 915 and the receiver 910 may be co-located in a transceiver, which may include or be coupled with a modem.

The communications component 920, the receiver 910, the transmitter 915, or various combinations thereof or various components thereof may be examples of means for performing various aspects of adaptive DPoD and MCS index reporting as described herein. For example, the communications component 920, the receiver 910, the transmitter 915, or various combinations or components thereof may support a method for performing one or more of the functions described herein.

In some examples, the communications component 920, the receiver 910, the transmitter 915, or various combinations or components thereof may be implemented in hardware (e.g., in communications management circuitry). The hardware may include a processor, a DSP, a CPU, an ASIC, an FPGA or other programmable logic device, a microcontroller, discrete gate or transistor logic, discrete hardware components, or any combination thereof configured as or otherwise supporting a means for performing the functions described in the present disclosure. In some examples, a processor and memory coupled with the processor may be configured to perform one or more of the functions described herein (e.g., by executing, by the processor, instructions stored in the memory).

Additionally, or alternatively, in some examples, the communications component 920, the receiver 910, the transmitter 915, or various combinations or components thereof may be implemented in code (e.g., as communications management software or firmware) executed by a processor. If implemented in code executed by a processor, the functions of the communications component 920, the receiver 910, the transmitter 915, or various combinations or components thereof may be performed by a general-purpose processor, a DSP, a CPU, an ASIC, an FPGA, a microcontroller, or any combination of these or other programmable logic devices (e.g., configured as or otherwise supporting a means for performing the functions described in the present disclosure).

In some examples, the communications component 920 may be configured to perform various operations (e.g., receiving, obtaining, monitoring, outputting, transmitting) using or otherwise in cooperation with the receiver 910, the transmitter 915, or both. For example, the communications component 920 may receive information from the receiver 910, send information to the transmitter 915, or be integrated in combination with the receiver 910, the transmitter 915, or both to obtain information, output information, or perform various other operations as described herein.

The communications component 920 may support wireless communications at a network entity in accordance with examples as disclosed herein. For example, the communications component 920 is capable of, configured to, or operable to support a means for transmitting an indication of a set of multiple digital post distortion kernels associated with the network entity, each DPoD kernel associated with one or more error vector magnitudes. The communications component 920 is capable of, configured to, or operable to support a means for receiving an indication of an MCS index in accordance with a DPoD kernel of the set of multiple DPoD kernels and a target error vector magnitude. The communications component 920 is capable of, configured to, or operable to support a means for transmitting a downlink message based on the MCS index.

By including or configuring the communications component 920 in accordance with examples as described herein, the device 905 (e.g., a processor controlling or otherwise coupled with the receiver 910, the transmitter 915, the communications component 920, or a combination thereof) may support techniques for adaptive DPoD and MCS index reporting which may result in reduced processing and reduced power consumption.

Figure 10:
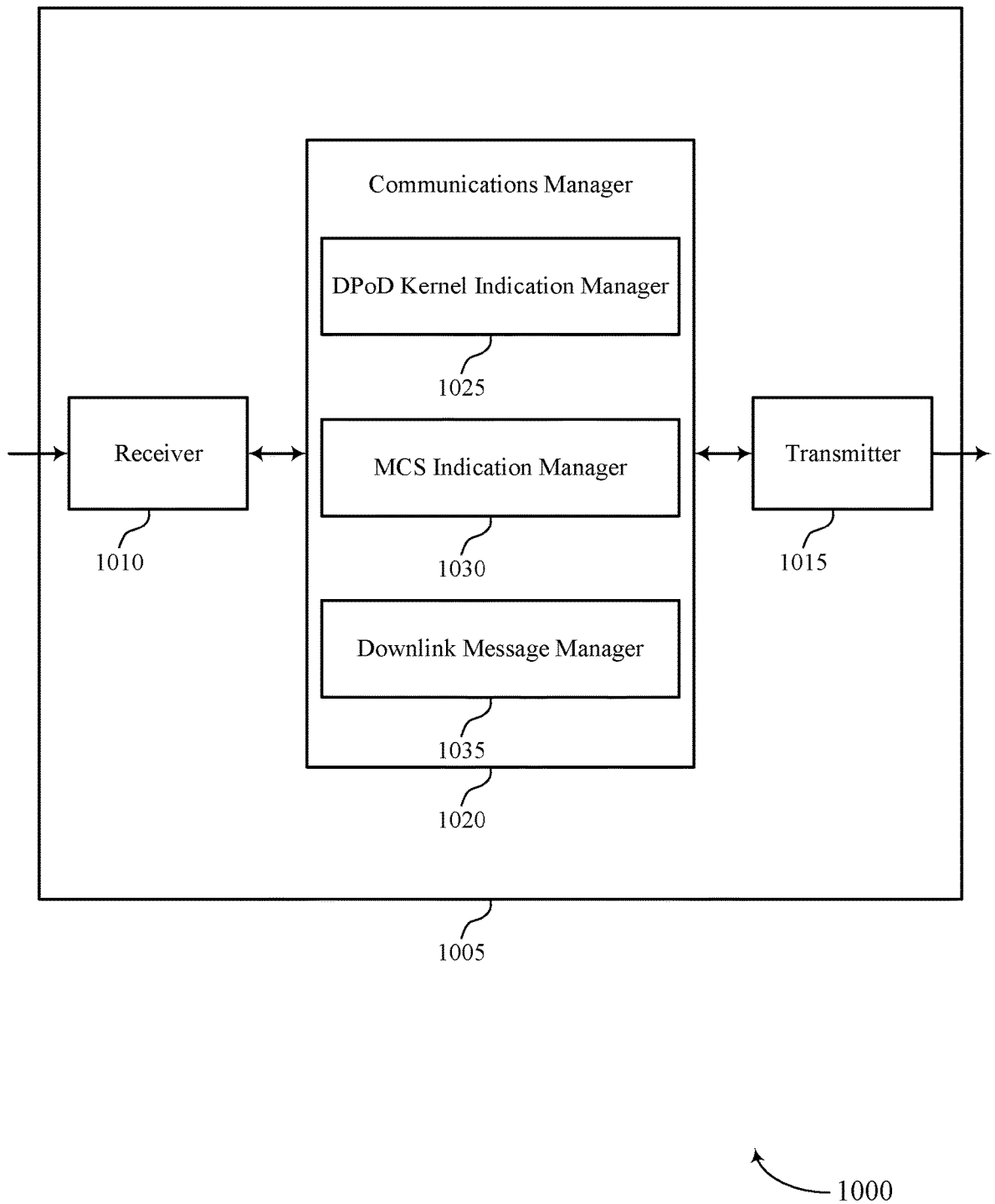

FIG. 10 shows a block diagram 1000 of a device 1005 that supports adaptive DPoD and MCS index reporting in accordance with one or more aspects of the present disclosure. The device 1005 may be an example of aspects of a device 905 or a network entity 105 as described herein. The device 1005 may include a receiver 1010, a transmitter 1015, and a communications component 1020. The device 1005 may also include a processor. Each of these components may be in communication with one another (e.g., via one or more buses).

The receiver 1010 may provide a means for obtaining (e.g., receiving, determining, identifying) information such as user data, control information, or any combination thereof (e.g., I/Q samples, symbols, packets, protocol data units, service data units) associated with various channels (e.g., control channels, data channels, information channels, channels associated with a protocol stack). Information may be passed on to other components of the device 1005. In some examples, the receiver 1010 may support obtaining information by receiving signals via one or more antennas. Additionally, or alternatively, the receiver 1010 may support obtaining information by receiving signals via one or more wired (e.g., electrical, fiber optic) interfaces, wireless interfaces, or any combination thereof.

The transmitter 1015 may provide a means for outputting (e.g., transmitting, providing, conveying, sending) information generated by other components of the device 1005. For example, the transmitter 1015 may output information such as user data, control information, or any combination thereof (e.g., I/Q samples, symbols, packets, protocol data units, service data units) associated with various channels (e.g., control channels, data channels, information channels, channels associated with a protocol stack). In some examples, the transmitter 1015 may support outputting information by transmitting signals via one or more antennas. Additionally, or alternatively, the transmitter 1015 may support outputting information by transmitting signals via one or more wired (e.g., electrical, fiber optic) interfaces, wireless interfaces, or any combination thereof. In some examples, the transmitter 1015 and the receiver 1010 may be co-located in a transceiver, which may include or be coupled with a modem.

The device 1005, or various components thereof, may be an example of means for performing various aspects of adaptive DPoD and MCS index reporting as described herein. For example, the communications component 1020 may include a DPoD kernel indication component 1025, an MCS indication component 1030, a downlink message component 1035, or any combination thereof. The communications component 1020 may be an example of aspects of a communications component 920 as described herein. In some examples, the communications component 1020, or various components thereof, may be configured to perform various operations (e.g., receiving, obtaining, monitoring, outputting, transmitting) using or otherwise in cooperation with the receiver 1010, the transmitter 1015, or both. For example, the communications component 1020 may receive information from the receiver 1010, send information to the transmitter 1015, or be integrated in combination with the receiver 1010, the transmitter 1015, or both to obtain information, output information, or perform various other operations as described herein.

The communications component 1020 may support wireless communications at a network entity in accordance with examples as disclosed herein. The DPoD kernel indication component 1025 is capable of, configured to, or operable to support a means for transmitting an indication of a set of multiple digital post distortion kernels associated with the network entity, each DPoD kernel associated with one or more error vector magnitudes. The MCS indication component 1030 is capable of, configured to, or operable to support a means for receiving an indication of an MCS index in accordance with a DPoD kernel of the set of multiple DPoD kernels and a target error vector magnitude. The downlink message component 1035 is capable of, configured to, or operable to support a means for transmitting a downlink message based on the MCS index.

Figure 11:
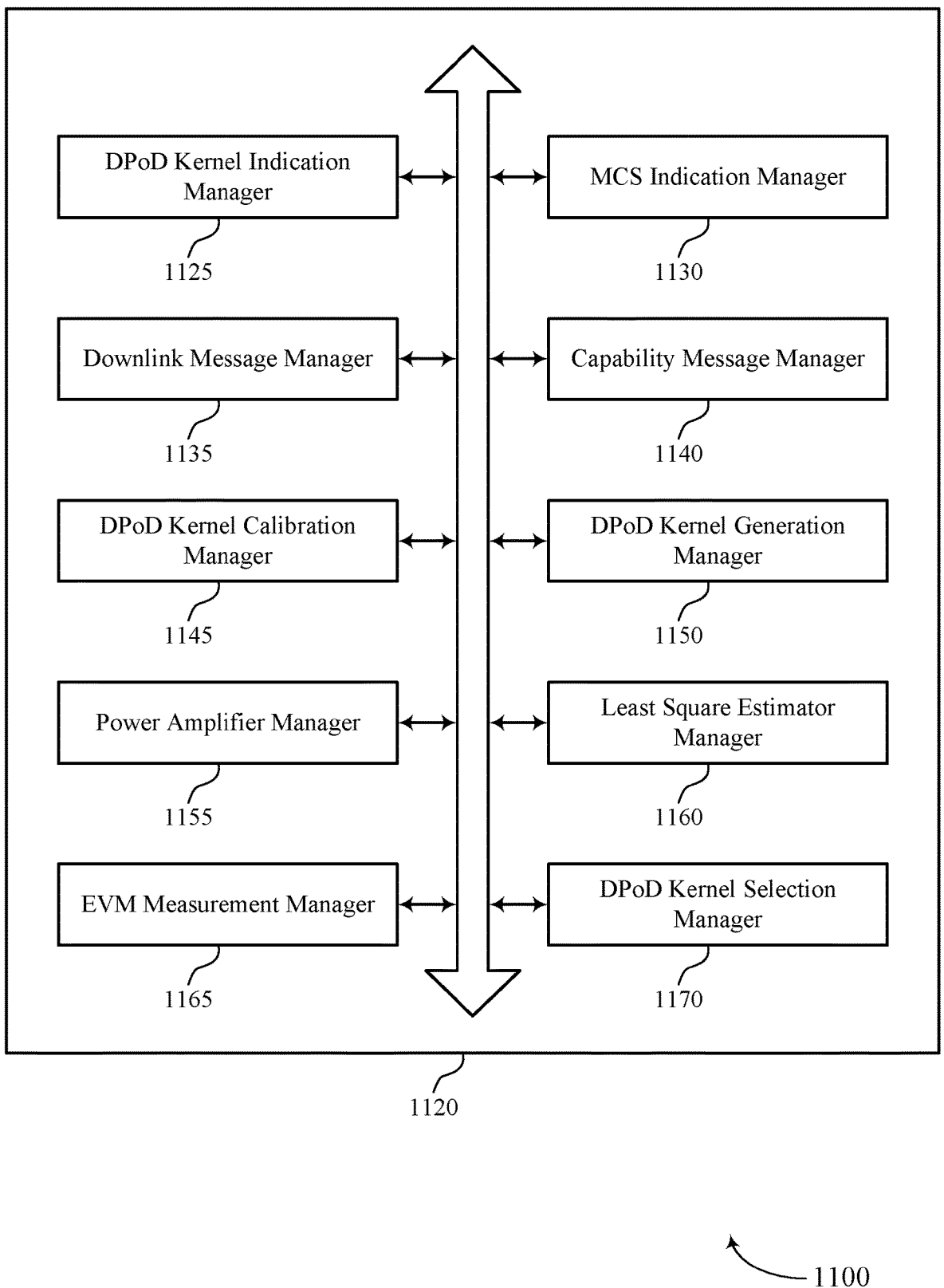
FIG. 11 shows a block diagram of a communications manager that supports adaptive DpoD and MCS index reporting in accordance with one or more aspects of the present disclosure.

FIG. 11 shows a block diagram 1100 of a communications component 1120 that supports adaptive DPoD and MCS index reporting in accordance with one or more aspects of the present disclosure. The communications component 1120 may be an example of aspects of a communications component 920, a communications component 1020, or both, as described herein. The communications component 1120, or various components thereof, may be an example of means for performing various aspects of adaptive DPoD and MCS index reporting as described herein. For example, the communications component 1120 may include a DPoD kernel indication component 1125, an MCS indication component 1130, a downlink message component 1135, a capability message component 1140, a DPoD kernel calibration component 1145, a DPoD kernel generation component 1150, a power amplifier component 1155, a least square estimator component 1160, a EVM measurement component 1165, a DPoD kernel selection component 1170, or any combination thereof. Each of these components may communicate, directly or indirectly, with one another (e.g., via one or more buses) which may include communications within a protocol layer of a protocol stack, communications associated with a logical channel of a protocol stack (e.g., between protocol layers of a protocol stack, within a device, component, or virtualized component associated with a network entity 105, between devices, components, or virtualized components associated with a network entity 105), or any combination thereof.

The communications component 1120 may support wireless communications at a network entity in accordance with examples as disclosed herein. The DPoD kernel indication component 1125 is capable of, configured to, or operable to support a means for transmitting an indication of a set of multiple digital post distortion kernels associated with the network entity, each DPoD kernel associated with one or more error vector magnitudes. The MCS indication component 1130 is capable of, configured to, or operable to support a means for receiving an indication of an MCS index in accordance with a DPoD kernel of the set of multiple DPoD kernels and a target error vector magnitude. The downlink message component 1135 is capable of, configured to, or operable to support a means for transmitting a downlink message based on the MCS index.

In some examples, the indication of the set of multiple DPoD kernels includes, for each DPoD kernel of the set of multiple DPoD kernels, an indication one or more corresponding error vector magnitudes.

In some examples, to support transmitting the downlink message, the downlink message component 1135 is capable of, configured to, or operable to support a means for transmitting the downlink message in accordance with a second MCS index that is different from the indicated MCS index based on a priority of the downlink message.

In some examples, the capability message component 1140 is capable of, configured to, or operable to support a means for receiving a capability message indicating a capability of a UE to perform adaptive DPoD.

In some examples, to support transmitting the indication of the set of multiple DPoD kernels, the DPoD kernel indication component 1125 is capable of, configured to, or operable to support a means for transmitting a medium access control-control element or a radio resource control message indicating the set of multiple DPoD kernels.

In some examples, the DPoD kernel calibration component 1145 is capable of, configured to, or operable to support a means for performing a calibration procedure to obtain the set of multiple post-distortion kernels associated with each of the one or more error vector magnitudes. In some examples, the DPoD kernel generation component 1150 is capable of, configured to, or operable to support a means for generating the set of multiple DPoD kernels and the one or more error vector magnitudes based on the calibration procedure.

In some examples, to support performing the calibration procedure, the power amplifier component 1155 is capable of, configured to, or operable to support a means for inputting a signal into one or more power amplifiers, where a transmission power of the signal is a same transmission power at which the network entity operates. In some examples, to support performing the calibration procedure, the least square estimator component 1160 is capable of, configured to, or operable to support a means for generating a least square estimator based on the input signal, an output signal from the one or more power amplifiers, and one or more DPoD kernels. In some examples, to support performing the calibration procedure, the power amplifier component 1155 is capable of, configured to, or operable to support a means for calculating an output of the one or more power amplifiers in accordance with the least square estimator. In some examples, to support performing the calibration procedure, the EVM measurement component 1165 is capable of, configured to, or operable to support a means for measuring an error vector magnitude using the output signal and the output of the one or more power amplifiers.

In some examples, the DPoD kernel selection component 1170 is capable of, configured to, or operable to support a means for selecting a DPoD kernel corresponding to an error vector magnitude, where a size of the DPoD kernel is less than a size of a second DPoD kernel corresponding to the error vector magnitude.

Figure 12:
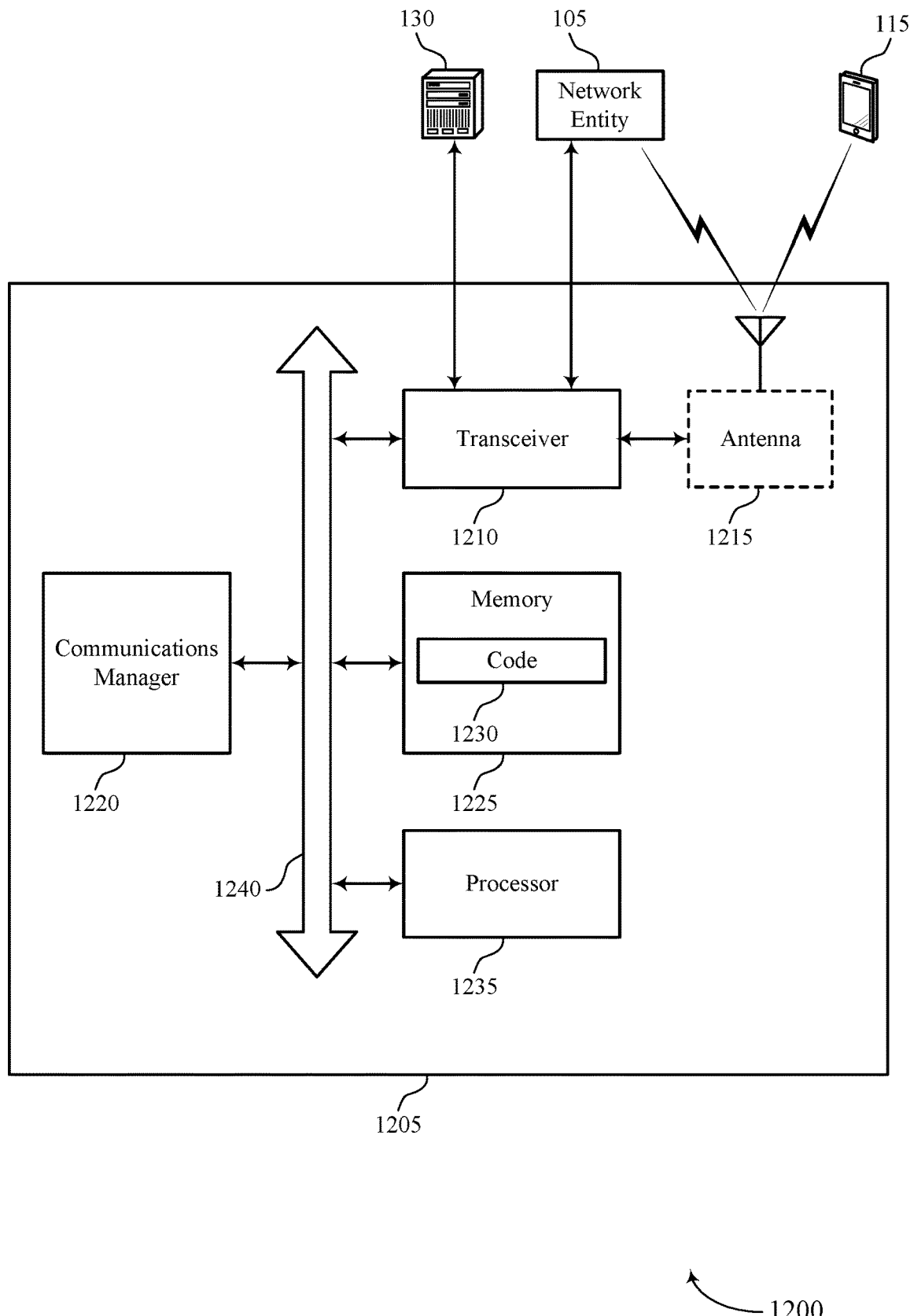
FIG. 12 shows a diagram of a system including a device that supports adaptive DpoD and MCS index reporting in accordance with one or more aspects of the present disclosure.

FIG. 12 shows a diagram of a system 1200 including a device 1205 that supports adaptive DPoD and MCS index reporting in accordance with one or more aspects of the present disclosure. The device 1205 may be an example of or include the components of a device 905, a device 1005, or a network entity 105 as described herein. The device 1205 may communicate with one or more network entities 105, one or more UEs 115, or any combination thereof, which may include communications over one or more wired interfaces, over one or more wireless interfaces, or any combination thereof. The device 1205 may include components that support outputting and obtaining communications, such as a communications component 1220, a transceiver 1210, an antenna 1215, a memory 1225, code 1230, and a processor 1235. These components may be in electronic communication or otherwise coupled (e.g., operatively, communicatively, functionally, electronically, electrically) via one or more buses (e.g., a bus 1240).

The transceiver 1210 may support bi-directional communications via wired links, wireless links, or both as described herein. In some examples, the transceiver 1210 may include a wired transceiver and may communicate bi-directionally with another wired transceiver. Additionally, or alternatively, in some examples, the transceiver 1210 may include a wireless transceiver and may communicate bi-directionally with another wireless transceiver. In some examples, the device 1205 may include one or more antennas 1215, which may be capable of transmitting or receiving wireless transmissions (e.g., concurrently). The transceiver 1210 may also include a modem to modulate signals, to provide the modulated signals for transmission (e.g., by one or more antennas 1215, by a wired transmitter), to receive modulated signals (e.g., from one or more antennas 1215, from a wired receiver), and to demodulate signals. In some implementations, the transceiver 1210 may include one or more interfaces, such as one or more interfaces coupled with the one or more antennas 1215 that are configured to support various receiving or obtaining operations, or one or more interfaces coupled with the one or more antennas 1215 that are configured to support various transmitting or outputting operations, or a combination thereof. In some implementations, the transceiver 1210 may include or be configured for coupling with one or more processors or memory components that are operable to perform or support operations based on received or obtained information or signals, or to generate information or other signals for transmission or other outputting, or any combination thereof. In some implementations, the transceiver 1210, or the transceiver 1210 and the one or more antennas 1215, or the transceiver 1210 and the one or more antennas 1215 and one or more processors or memory components (for example, the processor 1235, or the memory 1225, or both), may be included in a chip or chip assembly that is installed in the device 1205. In some examples, the transceiver may be operable to support communications via one or more communications links (e.g., a communication link 125, a backhaul communication link 120, a midhaul communication link 162, a fronthaul communication link 168).

The memory 1225 may include RAM and ROM. The memory 1225 may store computer-readable, computer-executable code 1230 including instructions that, when executed by the processor 1235, cause the device 1205 to perform various functions described herein. The code 1230 may be stored in a non-transitory computer-readable medium such as system memory or another type of memory. In some cases, the code 1230 may not be directly executable by the processor 1235 but may cause a computer (e.g., when compiled and executed) to perform functions described herein. In some cases, the memory 1225 may contain, among other things, a BIOS which may control basic hardware or software operation such as the interaction with peripheral components or devices.

The processor 1235 may include an intelligent hardware device (e.g., a general-purpose processor, a DSP, an ASIC, a CPU, an FPGA, a microcontroller, a programmable logic device, discrete gate or transistor logic, a discrete hardware component, or any combination thereof). In some cases, the processor 1235 may be configured to operate a memory array using a memory controller. In some other cases, a memory controller may be integrated into the processor 1235. The processor 1235 may be configured to execute computer-readable instructions stored in a memory (e.g., the memory 1225) to cause the device 1205 to perform various functions (e.g., functions or tasks supporting adaptive DPoD and MCS index reporting). For example, the device 1205 or a component of the device 1205 may include a processor 1235 and memory 1225 coupled with the processor 1235, the processor 1235 and memory 1225 configured to perform various functions described herein. The processor 1235 may be an example of a cloud-computing platform (e.g., one or more physical nodes and supporting software such as operating systems, virtual machines, or container instances) that may host the functions (e.g., by executing code 1230) to perform the functions of the device 1205. The processor 1235 may be any one or more suitable processors capable of executing scripts or instructions of one or more software programs stored in the device 1205 (such as within the memory 1225). In some implementations, the processor 1235 may be a component of a processing system. A processing system may generally refer to a system or series of machines or components that receives inputs and processes the inputs to produce a set of outputs (which may be passed to other systems or components of, for example, the device 1205). For example, a processing system of the device 1205 may refer to a system including the various other components or subcomponents of the device 1205, such as the processor 1235, or the transceiver 1210, or the communications component 1220, or other components or combinations of components of the device 1205. The processing system of the device 1205 may interface with other components of the device 1205, and may process information received from other components (such as inputs or signals) or output information to other components. For example, a chip or modem of the device 1205 may include a processing system and one or more interfaces to output information, or to obtain information, or both. The one or more interfaces may be implemented as or otherwise include a first interface configured to output information and a second interface configured to obtain information, or a same interface configured to output information and to obtain information, among other implementations. In some implementations, the one or more interfaces may refer to an interface between the processing system of the chip or modem and a transmitter, such that the device 1205 may transmit information output from the chip or modem. Additionally, or alternatively, in some implementations, the one or more interfaces may refer to an interface between the processing system of the chip or modem and a receiver, such that the device 1205 may obtain information or signal inputs, and the information may be passed to the processing system. A person having ordinary skill in the art will readily recognize that a first interface also may obtain information or signal inputs, and a second interface also may output information or signal outputs.

In some examples, a bus 1240 may support communications of (e.g., within) a protocol layer of a protocol stack. In some examples, a bus 1240 may support communications associated with a logical channel of a protocol stack (e.g., between protocol layers of a protocol stack), which may include communications performed within a component of the device 1205, or between different components of the device 1205 that may be co-located or located in different locations (e.g., where the device 1205 may refer to a system in which one or more of the communications component 1220, the transceiver 1210, the memory 1225, the code 1230, and the processor 1235 may be located in one of the different components or divided between different components).

In some examples, the communications component 1220 may manage aspects of communications with a core network 130 (e.g., via one or more wired or wireless backhaul links). For example, the communications component 1220 may manage the transfer of data communications for client devices, such as one or more UEs 115. In some examples, the communications component 1220 may manage communications with other network entities 105, and may include a controller or scheduler for controlling communications with UEs 115 in cooperation with other network entities 105. In some examples, the communications component 1220 may support an X2 interface within an LTE/LTE-A wireless communications network technology to provide communication between network entities 105.

The communications component 1220 may support wireless communications at a network entity in accordance with examples as disclosed herein. For example, the communications component 1220 is capable of, configured to, or operable to support a means for transmitting an indication of a set of multiple digital post distortion kernels associated with the network entity, each DPoD kernel associated with one or more error vector magnitudes. The communications component 1220 is capable of, configured to, or operable to support a means for receiving an indication of an MCS index in accordance with a DPoD kernel of the set of multiple DPoD kernels and a target error vector magnitude. The communications component 1220 is capable of, configured to, or operable to support a means for transmitting a downlink message based on the MCS index.

By including or configuring the communications component 1220 in accordance with examples as described herein, the device 1205 may support techniques for adaptive DPoD and MCS index reporting which may result in reduced latency, improved user experience related to reduced processing, reduced power consumption, improved coordination between devices, longer battery life, and improved utilization of processing capability.

In some examples, the communications component 1220 may be configured to perform various operations (e.g., receiving, obtaining, monitoring, outputting, transmitting) using or otherwise in cooperation with the transceiver 1210, the one or more antennas 1215 (e.g., where applicable), or any combination thereof. Although the communications component 1220 is illustrated as a separate component, in some examples, one or more functions described with reference to the communications component 1220 may be supported by or performed by the transceiver 1210, the processor 1235, the memory 1225, the code 1230, or any combination thereof. For example, the code 1230 may include instructions executable by the processor 1235 to cause the device 1205 to perform various aspects of adaptive DPoD and MCS index reporting as described herein, or the processor 1235 and the memory 1225 may be otherwise configured to perform or support such operations.

Figure 13:
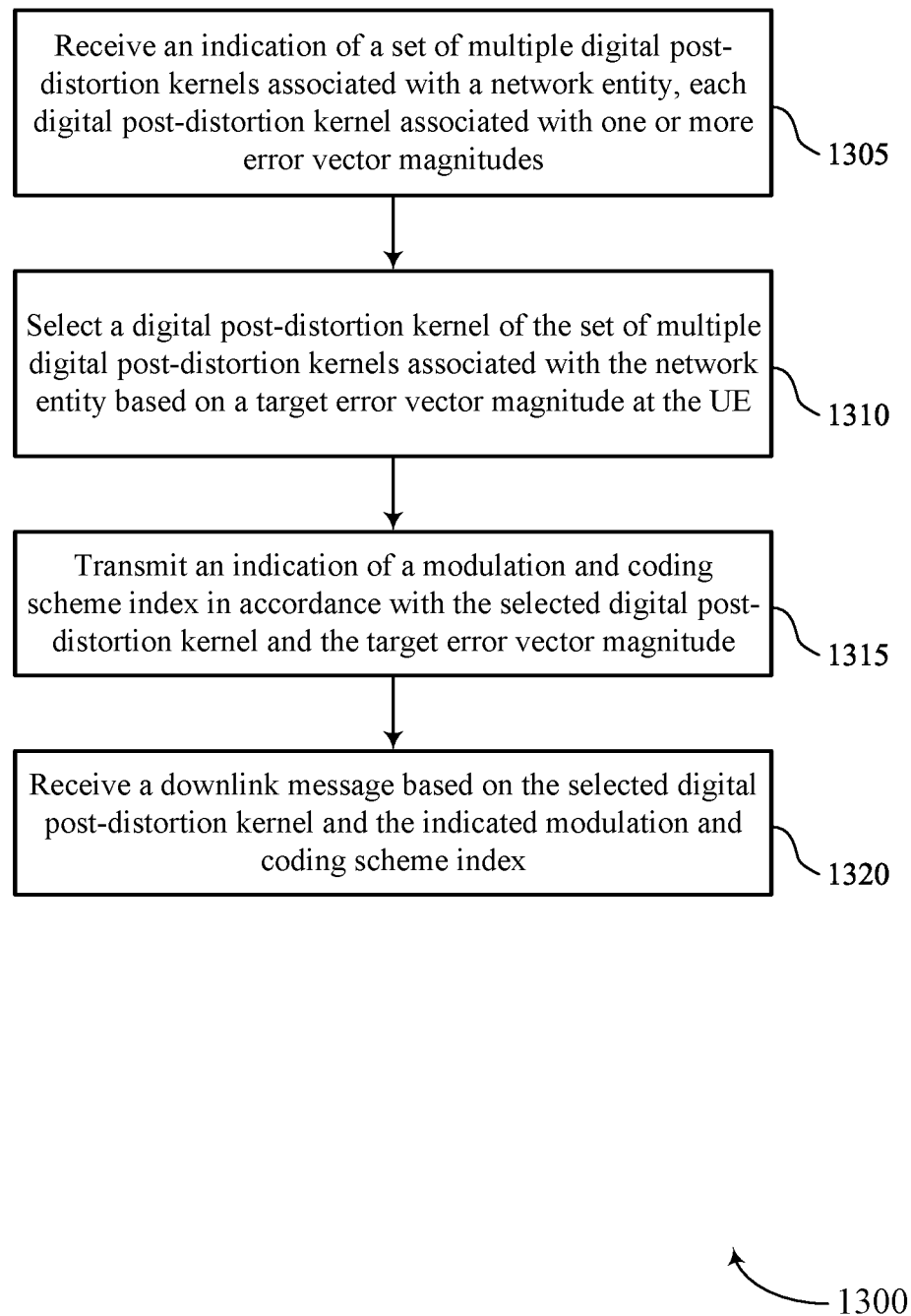
FIGS. 13 through 18 show flowcharts illustrating methods that support adaptive DpoD and MCS index reporting in accordance with one or more aspects of the present disclosure.

FIG. 13 shows a flowchart illustrating a method 1300 that supports adaptive DPoD and MCS index reporting in accordance with aspects of the present disclosure. The operations of the method 1300 may be implemented by a UE or its components as described herein. For example, the operations of the method 1300 may be performed by a UE 115 as described with reference to FIGS. 1 through 8. In some examples, a UE may execute a set of instructions to control the functional elements of the wireless UE to perform the described functions. Additionally, or alternatively, the wireless UE may perform aspects of the described functions using special-purpose hardware.

At 1305, the method may include receiving an indication of a set of multiple DPoD kernels associated with a network entity, each DPoD kernel associated with one or more error vector magnitudes. The operations of 1305 may be performed in accordance with examples as disclosed herein. In some examples, aspects of the operations of 1305 may be performed by a DPoD kernel indication manager 725 as described with reference to FIG. 7.

At 1310, the method may include selecting a DPoD kernel of the set of multiple DPoD kernels associated with the network entity based on a target error vector magnitude at the UE. The operations of 1310 may be performed in accordance with examples as disclosed herein. In some examples, aspects of the operations of 1310 may be performed by a DPoD kernel selection manager 730 as described with reference to FIG. 7.

At 1315, the method may include transmitting an indication of an MCS index in accordance with the selected DPoD kernel and the target error vector magnitude. The operations of 1315 may be performed in accordance with examples as disclosed herein. In some examples, aspects of the operations of 1315 may be performed by an MCS indication manager 735 as described with reference to FIG. 7.

At 1320, the method may include receiving a downlink message based on the selected DPoD kernel and the indicated MCS index. The operations of 1320 may be performed in accordance with examples as disclosed herein. In some examples, aspects of the operations of 1320 may be performed by a downlink message manager 740 as described with reference to FIG. 7.

Figure 14:
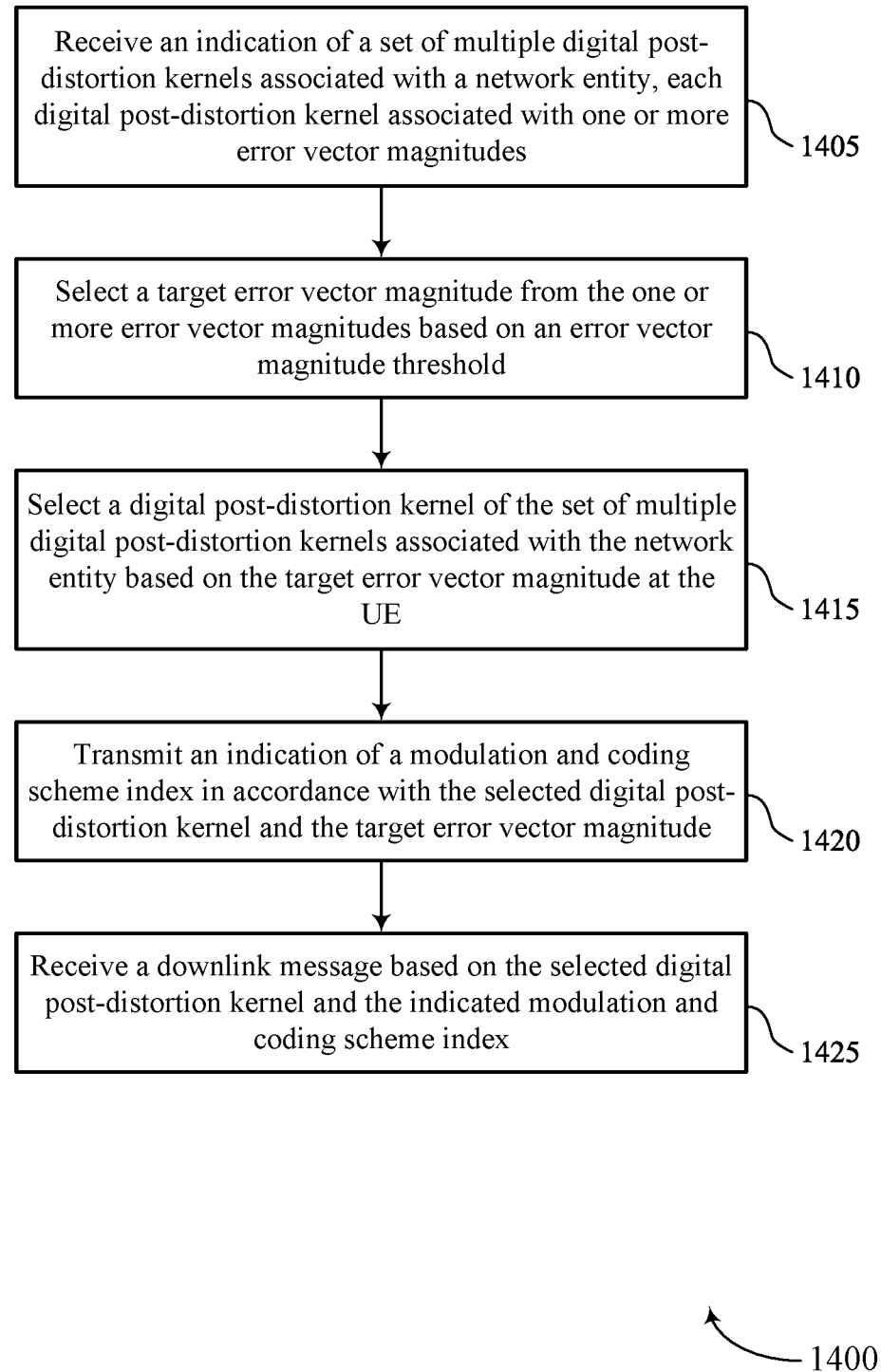

FIG. 14 shows a flowchart illustrating a method 1400 that supports adaptive DPoD and MCS index reporting in accordance with aspects of the present disclosure. The operations of the method 1400 may be implemented by a UE or its components as described herein. For example, the operations of the method 1400 may be performed by a UE 115 as described with reference to FIGS. 1 through 8. In some examples, a UE may execute a set of instructions to control the functional elements of the wireless UE to perform the described functions. Additionally, or alternatively, the wireless UE may perform aspects of the described functions using special-purpose hardware.

At 1405, the method may include receiving an indication of a set of multiple DPoD kernels associated with a network entity, each DPoD kernel associated with one or more error vector magnitudes. The operations of 1405 may be performed in accordance with examples as disclosed herein. In some examples, aspects of the operations of 1405 may be performed by a DPoD kernel indication manager 725 as described with reference to FIG. 7.

At 1410, the method may include selecting a target error vector magnitude from the one or more error vector magnitudes based on an error vector magnitude threshold. The operations of 1410 may be performed in accordance with examples as disclosed herein. In some examples, aspects of the operations of 1410 may be performed by a EVM selection manager 745 as described with reference to FIG. 7.

At 1415, the method may include selecting a DPoD kernel of the set of multiple DPoD kernels associated with the network entity based on the target error vector magnitude at the UE. The operations of 1415 may be performed in accordance with examples as disclosed herein. In some examples, aspects of the operations of 1415 may be performed by a DPoD kernel selection manager 730 as described with reference to FIG. 7.

At 1420, the method may include transmitting an indication of an MCS index in accordance with the selected DPoD kernel and the target error vector magnitude. The operations of 1420 may be performed in accordance with examples as disclosed herein. In some examples, aspects of the operations of 1420 may be performed by an MCS indication manager 735 as described with reference to FIG. 7.

At 1425, the method may include receiving a downlink message based on the selected DPoD kernel and the indicated MCS index. The operations of 1425 may be performed in accordance with examples as disclosed herein. In some examples, aspects of the operations of 1425 may be performed by a downlink message manager 740 as described with reference to FIG. 7.

Figure 15:
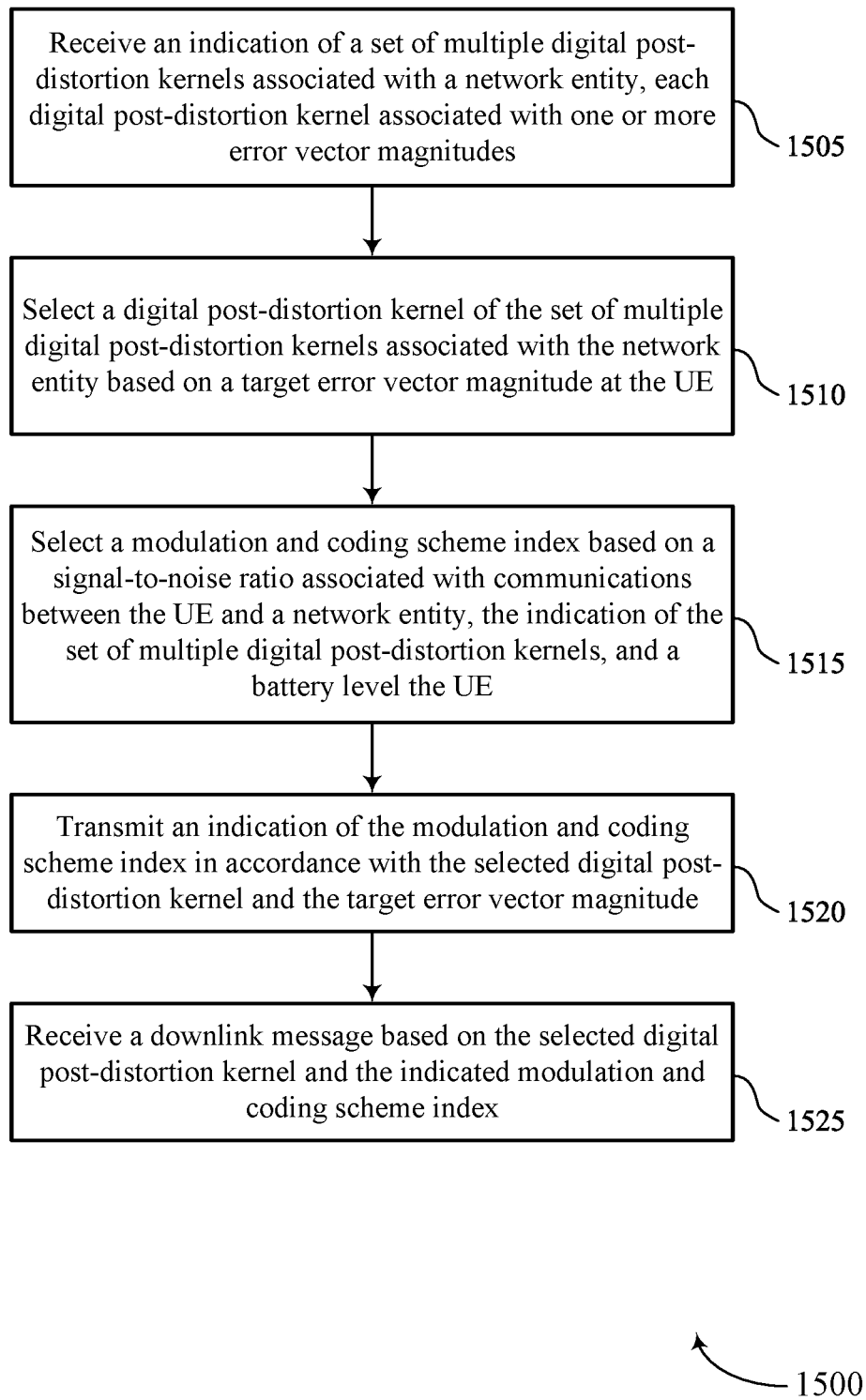

FIG. 15 shows a flowchart illustrating a method 1500 that supports adaptive DPoD and MCS index reporting in accordance with aspects of the present disclosure. The operations of the method 1500 may be implemented by a UE or its components as described herein. For example, the operations of the method 1500 may be performed by a UE 115 as described with reference to FIGS. 1 through 8. In some examples, a UE may execute a set of instructions to control the functional elements of the wireless UE to perform the described functions. Additionally, or alternatively, the wireless UE may perform aspects of the described functions using special-purpose hardware.

At 1505, the method may include receiving an indication of a set of multiple DPoD kernels associated with a network entity, each DPoD kernel associated with one or more error vector magnitudes. The operations of 1505 may be performed in accordance with examples as disclosed herein. In some examples, aspects of the operations of 1505 may be performed by a DPoD kernel indication manager 725 as described with reference to FIG. 7.

At 1510, the method may include selecting a DPoD kernel of the set of multiple DPoD kernels associated with the network entity based on a target error vector magnitude at the UE. The operations of 1510 may be performed in accordance with examples as disclosed herein. In some examples, aspects of the operations of 1510 may be performed by a DPoD kernel selection manager 730 as described with reference to FIG. 7.

At 1515, the method may include selecting an MCS index based on a signal-to-noise ratio associated with communications between the UE and a network entity, the indication of the set of multiple DPoD kernels, and a battery level the UE. The operations of 1515 may be performed in accordance with examples as disclosed herein. In some examples, aspects of the operations of 1515 may be performed by an MCS selection manager 750 as described with reference to FIG. 7.

At 1520, the method may include transmitting an indication of the MCS index in accordance with the selected DPoD kernel and the target error vector magnitude. The operations of 1520 may be performed in accordance with examples as disclosed herein. In some examples, aspects of the operations of 1520 may be performed by an MCS indication manager 735 as described with reference to FIG. 7.

At 1525, the method may include receiving a downlink message based on the selected DPoD kernel and the indicated MCS index. The operations of 1525 may be performed in accordance with examples as disclosed herein. In some examples, aspects of the operations of 1525 may be performed by a downlink message manager 740 as described with reference to FIG. 7.

Figure 16:
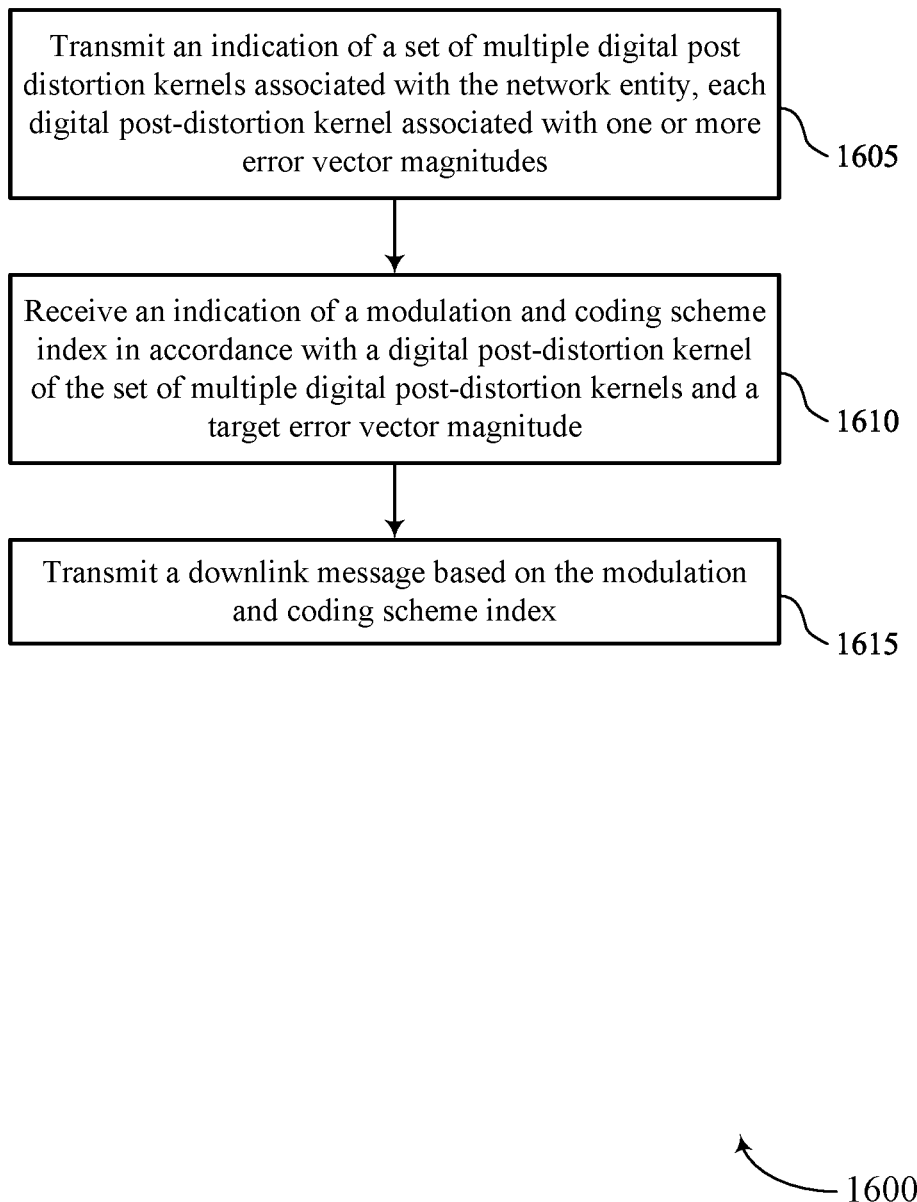

FIG. 16 shows a flowchart illustrating a method 1600 that supports adaptive DPoD and MCS index reporting in accordance with aspects of the present disclosure. The operations of the method 1600 may be implemented by a network entity or its components as described herein. For example, the operations of the method 1600 may be performed by a network entity as described with reference to FIGS. 1 through 4 and 9 through 12. In some examples, a network entity may execute a set of instructions to control the functional elements of the wireless network entity to perform the described functions. Additionally, or alternatively, the wireless network entity may perform aspects of the described functions using special-purpose hardware.

At 1605, the method may include transmitting an indication of a set of multiple digital post distortion kernels associated with the network entity, each DPoD kernel associated with one or more error vector magnitudes. The operations of 1605 may be performed in accordance with examples as disclosed herein. In some examples, aspects of the operations of 1605 may be performed by a DPoD kernel indication component 1125 as described with reference to FIG. 11.

At 1610, the method may include receiving an indication of an MCS index in accordance with a DPoD kernel of the set of multiple DPoD kernels and a target error vector magnitude. The operations of 1610 may be performed in accordance with examples as disclosed herein. In some examples, aspects of the operations of 1610 may be performed by an MCS indication component 1130 as described with reference to FIG. 11.

At 1615, the method may include transmitting a downlink message based on the MCS index. The operations of 1615 may be performed in accordance with examples as disclosed herein. In some examples, aspects of the operations of 1615 may be performed by a downlink message component 1135 as described with reference to FIG. 11.

Figure 17:
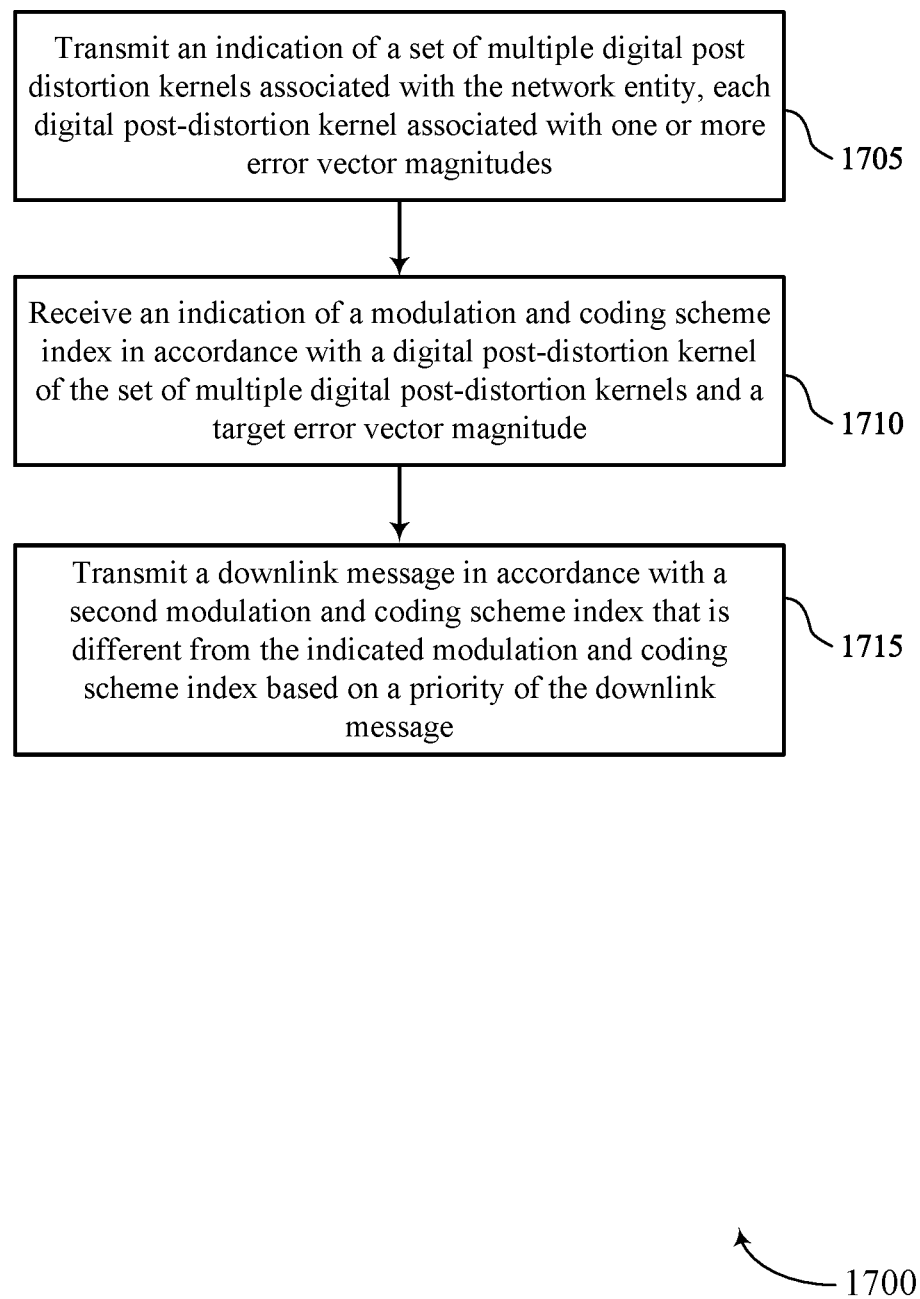

FIG. 17 shows a flowchart illustrating a method 1700 that supports adaptive DPoD and MCS index reporting in accordance with aspects of the present disclosure. The operations of the method 1700 may be implemented by a network entity or its components as described herein. For example, the operations of the method 1700 may be performed by a network entity as described with reference to FIGS. 1 through 4 and 9 through 12. In some examples, a network entity may execute a set of instructions to control the functional elements of the wireless network entity to perform the described functions. Additionally, or alternatively, the wireless network entity may perform aspects of the described functions using special-purpose hardware.

At 1705, the method may include transmitting an indication of a set of multiple digital post distortion kernels associated with the network entity, each DPoD kernel associated with one or more error vector magnitudes. The operations of 1705 may be performed in accordance with examples as disclosed herein. In some examples, aspects of the operations of 1705 may be performed by a DPoD kernel indication component 1125 as described with reference to FIG. 11.

At 1710, the method may include receiving an indication of an MCS index in accordance with a DPoD kernel of the set of multiple DPoD kernels and a target error vector magnitude. The operations of 1710 may be performed in accordance with examples as disclosed herein. In some examples, aspects of the operations of 1710 may be performed by an MCS indication component 1130 as described with reference to FIG. 11.

At 1715, the method may include transmitting a downlink message in accordance with a second MCS index that is different from the indicated MCS index based on a priority of the downlink message. The operations of 1715 may be performed in accordance with examples as disclosed herein. In some examples, aspects of the operations of 1715 may be performed by a downlink message component 1135 as described with reference to FIG. 11.

Figure 18:
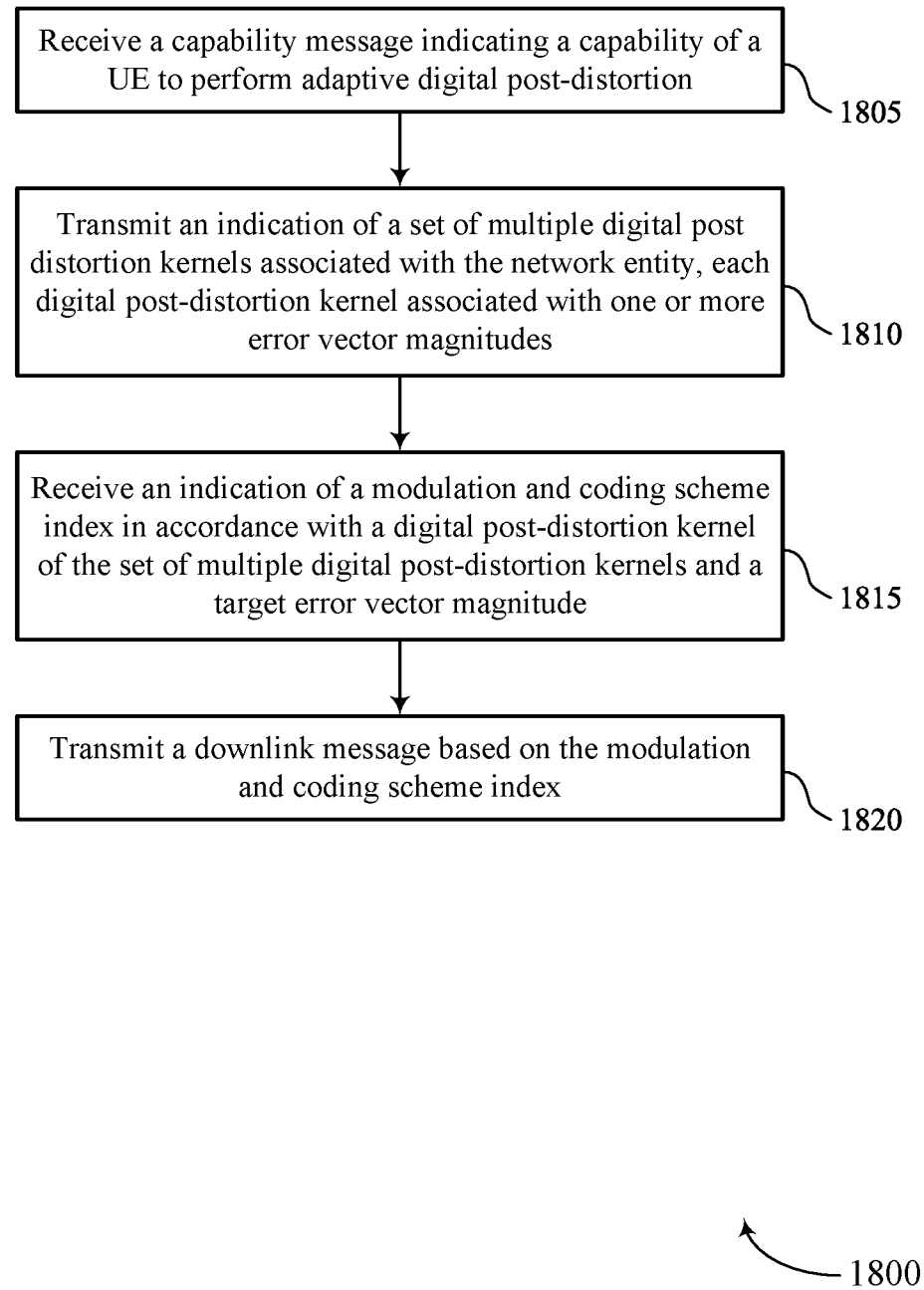

FIG. 18 shows a flowchart illustrating a method 1800 that supports adaptive DPoD and MCS index reporting in accordance with aspects of the present disclosure. The operations of the method 1800 may be implemented by a network entity or its components as described herein. For example, the operations of the method 1800 may be performed by a network entity as described with reference to FIGS. 1 through 4 and 9 through 12. In some examples, a network entity may execute a set of instructions to control the functional elements of the wireless network entity to perform the described functions. Additionally, or alternatively, the wireless network entity may perform aspects of the described functions using special-purpose hardware.

At 1805, the method may include receiving a capability message indicating a capability of a UE to perform adaptive DPoD. The operations of 1805 may be performed in accordance with examples as disclosed herein. In some examples, aspects of the operations of 1805 may be performed by a capability message component 1140 as described with reference to FIG. 11.

At 1810, the method may include transmitting an indication of a set of multiple digital post distortion kernels associated with the network entity, each DPoD kernel associated with one or more error vector magnitudes. The operations of 1810 may be performed in accordance with examples as disclosed herein. In some examples, aspects of the operations of 1810 may be performed by a DPoD kernel indication component 1125 as described with reference to FIG. 11.

At 1815, the method may include receiving an indication of an MCS index in accordance with a DPoD kernel of the set of multiple DPoD kernels and a target error vector magnitude. The operations of 1815 may be performed in accordance with examples as disclosed herein. In some examples, aspects of the operations of 1815 may be performed by an MCS indication component 1130 as described with reference to FIG. 11.

At 1820, the method may include transmitting a downlink message based on the MCS index. The operations of 1820 may be performed in accordance with examples as disclosed herein. In some examples, aspects of the operations of 1820 may be performed by a downlink message component 1135 as described with reference to FIG. 11.

The following provides an overview of aspects of the present disclosure:

Aspect 1: A method for wireless communications at a UE, comprising: receiving an indication of a plurality of DPoD kernels associated with a network entity, each DPoD kernel associated with one or more EVMs; selecting a DPoD kernel of the plurality of DPoD kernels associated with the network entity based at least in part on a target EVM at the UE; transmitting an indication of an MCS index in accordance with the selected DPoD kernel and the target EVM; and receiving a downlink message based at least in part on the selected DPoD kernel and the indicated MCS index.

Aspect 2: The method of aspect 1, wherein selecting the DPoD kernel comprises: selecting the target EVM from the one or more EVMs based at least in part on an EVM threshold.

Aspect 3: The method of aspect 2, wherein the EVM threshold is based at least in part on one or more of a modulation order, an MCS, a battery level of the UE, or any combination thereof.

Aspect 4: The method of any of aspects 1 through 3, further comprising: selecting the MCS index based at least in part on a SNR associated with communications between the UE and a network entity, the indication of the plurality of DPoD kernels, and a battery level the UE.

Aspect 5: The method of any of aspects 1 through 4, wherein the indication of the plurality of DPoD kernels comprises, for each DPoD kernel of the plurality of DPoD kernels, an indication one or more corresponding EVMs.

Aspect 6: The method of any of aspects 1 through 5, wherein receiving the downlink message comprises: receiving the downlink message in accordance with a second MCS index that is different from the indicated MCS index based at least in part on a priority of the downlink message.

Aspect 7: The method of any of aspects 1 through 6, further comprising: demodulating the downlink message based at least in part on the selected DPoD kernel and the indicated MCS index.

Aspect 8: The method of any of aspects 1 through 7, further comprising: transmitting a capability message indicating a capability of the UE to perform adaptive DPoD.

Aspect 9: The method of any of aspects 1 through 8, wherein receiving the indication of the plurality of DPoD kernels comprises: receiving a MAC-CE or an RRC message indicating the plurality of DPoD kernels.

Aspect 10: A method for wireless communications at a network entity, comprising: transmitting an indication of a plurality of DPoD kernels associated with the network entity, each DPoD kernel associated with one or more EVMs; receiving an indication of an MCS index in accordance with a DPoD kernel of the plurality of DPoD kernels and a target EVM; and transmitting a downlink message based at least in part on the MCS index.

Aspect 11: The method of aspect 10, wherein the indication of the plurality of DPoD kernels comprises, for each DPoD kernel of the plurality of DPoD kernels, an indication one or more corresponding EVMs.

Aspect 12: The method of any of aspects 10 through 11, wherein transmitting the downlink message comprises: transmitting the downlink message in accordance with a second MCS index that is different from the indicated MCS index based at least in part on a priority of the downlink message.

Aspect 13: The method of any of aspects 10 through 12, further comprising: receiving a capability message indicating a capability of a UE to perform adaptive DPoD.

Aspect 14: The method of any of aspects 10 through 13, wherein transmitting the indication of the plurality of DPoD kernels comprises: transmitting a MAC-CE or an RRC message indicating the plurality of DPoD kernels.

Aspect 15: The method of any of aspects 10 through 14, further comprising: performing a calibration procedure to obtain the plurality of post-distortion kernels associated with each of the one or more EVMs; and generating the plurality of DPoD kernels and the one or more EVMs based at least in part on the calibration procedure.

Aspect 16: The method of aspect 15, wherein performing the calibration procedure comprises: inputting a signal into one or more PAs, wherein a transmission power of the signal is a same transmission power at which the network entity operates; generating an LS estimator based at least in part on the input signal, an output signal from the one or more PAs, and one or more DPoD kernels; calculating an output of the one or more PAs in accordance with the LS estimator; and measuring an EVM using the output signal and the output of the one or more PAs.

Aspect 17: The method of any of aspects 15 through 16, further comprising: selecting a DPoD kernel corresponding to an EVM, wherein a size of the DPoD kernel is less than a size of a second DPoD kernel corresponding to the EVM.

Aspect 18: An apparatus for wireless communications at a UE, comprising a processor; memory coupled with the processor; and instructions stored in the memory and executable by the processor to cause the apparatus to perform a method of any of aspects 1 through 9.

Aspect 19: An apparatus for wireless communications at a UE, comprising at least one means for performing a method of any of aspects 1 through 9.

Aspect 20: A non-transitory computer-readable medium storing code for wireless communications at a UE, the code comprising instructions executable by a processor to perform a method of any of aspects 1 through 9.

Aspect 21: An apparatus for wireless communications at a network entity, comprising a processor; memory coupled with the processor; and instructions stored in the memory and executable by the processor to cause the apparatus to perform a method of any of aspects 10 through 17.

Aspect 22: An apparatus for wireless communications at a network entity, comprising at least one means for performing a method of any of aspects 10 through 17.

Aspect 23: A non-transitory computer-readable medium storing code for wireless communications at a network entity, the code comprising instructions executable by a processor to perform a method of any of aspects 10 through 17.

It should be noted that the methods described herein describe possible implementations, and that the operations and the steps may be rearranged or otherwise modified and that other implementations are possible. Further, aspects from two or more of the methods may be combined.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed using a general-purpose processor, a DSP, an ASIC, a CPU, an FPGA or other programmable logic device, discrete gate or transistor logic, discrete hardware components, or any combination thereof designed to perform the functions described herein. A general-purpose processor may be a microprocessor but, in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented using hardware, software executed by a processor, firmware, or any combination thereof. If implemented using software executed by a processor, the functions may be stored as or transmitted using one or more instructions or code of a computer-readable medium. Other examples and implementations are within the scope of the disclosure and appended claims. For example, due to the nature of software, functions described herein may be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one location to another. A non-transitory storage medium may be any available medium that may be accessed by a general-purpose or special-purpose computer. By way of example, and not limitation, non-transitory computer-readable media may include RAM, ROM, electrically erasable programmable ROM (EEPROM), flash memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc. Disks may reproduce data magnetically, and discs may reproduce data optically using lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on."

The term "determine" or "determining" encompasses a variety of actions and, therefore, "determining" can include calculating, computing, processing, deriving, investigating, looking up (such as via looking up in a table, a database or another data structure), ascertaining and the like. Also, "determining" can include receiving (e.g., receiving information), accessing (e.g., accessing data stored in memory) and the like. Also, "determining" can include resolving, obtaining, selecting, choosing, establishing, and other such similar actions.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus for wireless communications at a user equipment (UE), comprising:
   a processor;
   memory coupled with the processor; and
   instructions stored in the memory and executable by the processor to cause the apparatus to:
      receive an indication of a plurality of digital post-distortion kernels associated with a network entity, each digital post-distortion kernel associated with one or more error vector magnitudes;
      select a digital post-distortion kernel of the plurality of digital post-distortion kernels associated with the network entity based at least in part on a target error vector magnitude at the UE;
      transmit an indication of a modulation and coding scheme index in accordance with the selected digital post-distortion kernel and the target error vector magnitude; and
      receive a downlink message based at least in part on the selected digital post-distortion kernel and the indicated modulation and coding scheme index.

2. The apparatus of claim 1, wherein the instructions to select the digital post-distortion kernel are executable by the processor to cause the apparatus to:
   select the target error vector magnitude from the one or more error vector magnitudes based at least in part on an error vector magnitude threshold.

3. The apparatus of claim 2, wherein the error vector magnitude threshold is based at least in part on one or more of a modulation order, a modulation and coding scheme, a battery level of the UE, or any combination thereof.

4. The apparatus of claim 1, wherein the instructions are further executable by the processor to cause the apparatus to:
   select the modulation and coding scheme index based at least in part on a signal-to-noise ratio associated with communications between the UE and the network entity, the indication of the plurality of digital post-distortion kernels, and a battery level the UE.

5. The apparatus of claim 1, wherein the indication of the plurality of digital post-distortion kernels comprises, for each digital post-distortion kernel of the plurality of digital post-distortion kernels, an indication of one or more corresponding error vector magnitudes.

6. The apparatus of claim 1, wherein the instructions to receive the downlink message are executable by the processor to cause the apparatus to:
   receive the downlink message in accordance with a second modulation and coding scheme index that is different from the indicated modulation and coding scheme index based at least in part on a priority of the downlink message.

7. The apparatus of claim 1, wherein the instructions are further executable by the processor to cause the apparatus to:
   demodulate the downlink message based at least in part on the selected digital post-distortion kernel and the indicated modulation and coding scheme index.

8. The apparatus of claim 1, wherein the instructions are further executable by the processor to cause the apparatus to:
   transmit a capability message indicating a capability of the UE to perform adaptive digital post-distortion.

9. The apparatus of claim 1, wherein the instructions to receive the indication of the plurality of digital post-distortion kernels are executable by the processor to cause the apparatus to:
   receive a medium access control-control element or a radio resource control message indicating the plurality of digital post-distortion kernels.

10. An apparatus for wireless communications at a network entity, comprising:
    a processor;
    memory coupled with the processor; and
    instructions stored in the memory and executable by the processor to cause the apparatus to:
       transmit an indication of a plurality of digital post-distortion kernels associated with the network entity, each digital post-distortion kernel associated with one or more error vector magnitudes;
       receive an indication of a modulation and coding scheme index in accordance with a digital post-distortion kernel of the plurality of digital post-distortion kernels and a target error vector magnitude; and
       transmit a downlink message based at least in part on the modulation and coding scheme index.

11. The apparatus of claim 10, wherein the indication of the plurality of digital post-distortion kernels comprises, for each digital post-distortion kernel of the plurality of digital post-distortion kernels, an indication of one or more corresponding error vector magnitudes.

12. The apparatus of claim 10, wherein the instructions to transmit the downlink message are executable by the processor to cause the apparatus to:
    transmit the downlink message in accordance with a second modulation and coding scheme index that is different from the indicated modulation and coding scheme index based at least in part on a priority of the downlink message.

13. The apparatus of claim 10, wherein the instructions are further executable by the processor to cause the apparatus to:
    receive a capability message indicating a capability of a user equipment (UE) to perform adaptive digital post-distortion.

14. The apparatus of claim 10, wherein the instructions to transmit the indication of the plurality of digital post-distortion kernels are executable by the processor to cause the apparatus to:
    transmit a medium access control-control element or a radio resource control message indicating the plurality of digital post-distortion kernels.

15. The apparatus of claim 10, wherein the instructions are further executable by the processor to cause the apparatus to:
    perform a calibration procedure to obtain the plurality of post-distortion kernels associated with each of the one or more error vector magnitudes; and
    generate the plurality of digital post-distortion kernels and the one or more error vector magnitudes based at least in part on the calibration procedure.

16. The apparatus of claim 15, wherein the instructions to perform the calibration procedure are executable by the processor to cause the apparatus to:
- input a signal into one or more power amplifiers, wherein a transmission power of the signal is a same transmission power at which the network entity operates;
- generate a least square estimator based at least in part on the input signal, an output signal from the one or more power amplifiers, and one or more digital post-distortion kernels;
- calculate an output of the one or more power amplifiers in accordance with the least square estimator; and
- measure an error vector magnitude using the output signal and the output of the one or more power amplifiers.

17. The apparatus of claim 15, wherein the instructions are further executable by the processor to cause the apparatus to:
- select a digital post-distortion kernel corresponding to an error vector magnitude, wherein a size of the digital post-distortion kernel is less than a size of a second digital post-distortion kernel corresponding to the error vector magnitude.

18. A method for wireless communications at a user equipment (UE), comprising:
- receiving an indication of a plurality of digital post-distortion kernels associated with a network entity, each digital post-distortion kernel associated with one or more error vector magnitudes;
- selecting a digital post-distortion kernel of the plurality of digital post-distortion kernels associated with the network entity based at least in part on a target error vector magnitude at the UE;
- transmitting an indication of a modulation and coding scheme index in accordance with the selected digital post-distortion kernel and the target error vector magnitude; and
- receiving a downlink message based at least in part on the selected digital post-distortion kernel and the indicated modulation and coding scheme index.

19. The method of claim 18, wherein selecting the digital post-distortion kernel comprises:
- selecting the target error vector magnitude from the one or more error vector magnitudes based at least in part on an error vector magnitude threshold.

20. The method of claim 19, wherein the error vector magnitude threshold is based at least in part on one or more of a modulation order, a modulation and coding scheme, a battery level of the UE, or any combination thereof.

21. The method of claim 18, further comprising:
- selecting the modulation and coding scheme index based at least in part on a signal-to-noise ratio associated with communications between the UE and the network entity, the indication of the plurality of digital post-distortion kernels, and a battery level the UE.

22. The method of claim 18, wherein the indication of the plurality of digital post-distortion kernels comprises, for each digital post-distortion kernel of the plurality of digital post-distortion kernels, an indication of one or more corresponding error vector magnitudes.

23. The method of claim 18, wherein receiving the downlink message comprises:
- receiving the downlink message in accordance with a second modulation and coding scheme index that is different from the indicated modulation and coding scheme index based at least in part on a priority of the downlink message.

24. The method of claim 18, further comprising:
- demodulating the downlink message based at least in part on the selected digital post-distortion kernel and the indicated modulation and coding scheme index.

25. The method of claim 18, further comprising:
- transmitting a capability message indicating a capability of the UE to perform adaptive digital post-distortion.

26. The method of claim 18, wherein receiving the indication of the plurality of digital post-distortion kernels comprises:
- receiving a medium access control-control element or a radio resource control message indicating the plurality of digital post-distortion kernels.

27. A method for wireless communications at a network entity, comprising:
- transmitting an indication of a plurality of digital post distortion kernels associated with the network entity, each digital post-distortion kernel associated with one or more error vector magnitudes;
- receiving an indication of a modulation and coding scheme index in accordance with a digital post-distortion kernel of the plurality of digital post-distortion kernels and a target error vector magnitude; and
- transmitting a downlink message based at least in part on the modulation and coding scheme index.

28. The method of claim 27, wherein the indication of the plurality of digital post-distortion kernels comprises, for each digital post-distortion kernel of the plurality of digital post-distortion kernels, an indication of one or more corresponding error vector magnitudes.

29. The method of claim 27, wherein transmitting the downlink message comprises:
- transmitting the downlink message in accordance with a second modulation and coding scheme index that is different from the indicated modulation and coding scheme index based at least in part on a priority of the downlink message.

30. The method of claim 27, further comprising:
- receiving a capability message indicating a capability of a user equipment (UE) to perform adaptive digital post-distortion.

\* \* \* \* \*